United States Patent
Enomoto et al.

(10) Patent No.: US 6,787,446 B2
(45) Date of Patent: Sep. 7, 2004

(54) FABRICATION METHOD OF SEMICONDUCTOR INTEGRATED CIRCUIT DEVICE

(75) Inventors: Hiroyuki Enomoto, Tokyo (JP); Kazutami Tago, Tokyo (JP); Atsushi Maekawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/188,001

(22) Filed: Jul. 3, 2002

(65) Prior Publication Data

US 2003/0032284 A1 Feb. 13, 2003

(30) Foreign Application Priority Data

Aug. 7, 2001 (JP) .................................. 2001-239712
Apr. 2, 2002 (JP) .................................. 2002-100235

(51) Int. Cl.[7] ........................................ H01L 21/4763
(52) U.S. Cl. ................... 438/623; 438/624; 438/634; 438/637; 438/638; 438/687
(58) Field of Search ................. 438/623, 624, 438/634, 637, 638, 687

(56) References Cited

U.S. PATENT DOCUMENTS 6,331,481 B1 * 12/2001 Stamper et al. .............. 438/624
6,372,636 B1 *  4/2002 Chooi et al. ................. 438/687
6,429,122 B2 *  8/2002 Chooi et al. ................. 438/637

FOREIGN PATENT DOCUMENTS

| JP | 05-267246 | 10/1993 |
|---|---|---|
| JP | 05-326499 | 12/1993 |
| JP | 06-208977 | 7/1994 |
| JP | 07-161690 | 6/1995 |
| JP | 07-235525 | 9/1995 |
| JP | 10-321838 | 12/1998 |
| JP | 2000-355779 | 12/2000 |
| JP | 2001-210627 | 8/2001 |

* cited by examiner

Primary Examiner—Lynne A. Gurley
(74) Attorney, Agent, or Firm—Miles & Stockbridge P.C.

(57) ABSTRACT

The following defects are suppressed: when an interlayer insulating film including a silicon carbide film and an organic insulating film is dry-etched to form interconnection grooves over underlying Cu interconnections, an insulating reactant adheres to the surface of the underlying Cu interconnections exposed to the bottom of the interconnection grooves, or the silicon carbide film or the organic insulating film exposed to the side walls of the interconnection grooves are side-etched. When a lamination film made of a silicon oxide film, an organic insulating film, a silicon oxide film, an organic insulating film and a silicon carbide film is dry-etched to form interconnection grooves over Cu interconnections, a mixed gas of $SF_6$ and $NH_3$ is used as an etching gas for the silicon carbide film to work side walls of the interconnection grooves perpendicularly and further suppress defects that a deposit or a reactant adheres to the surface of the Cu interconnections exposed to the bottom of the interconnection grooves.

7 Claims, 31 Drawing Sheets

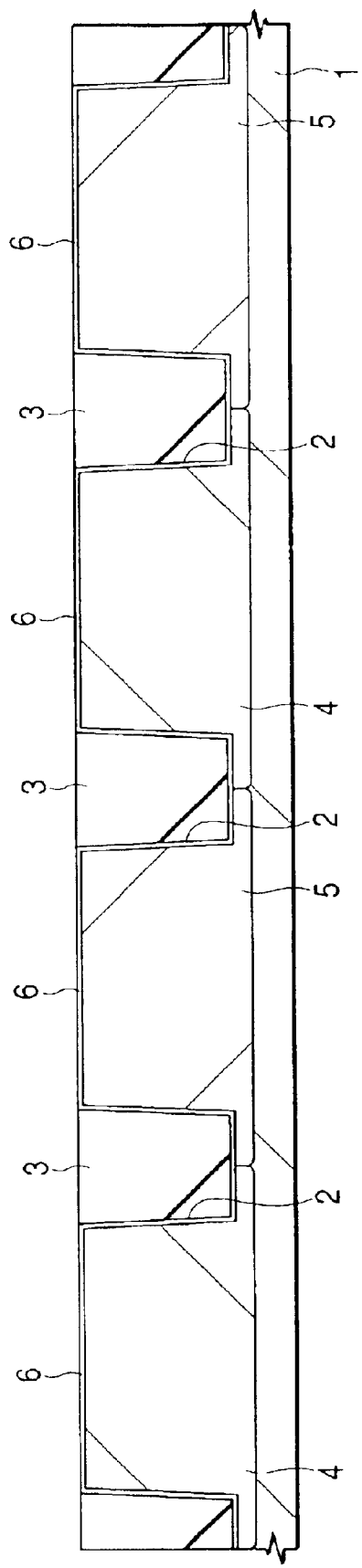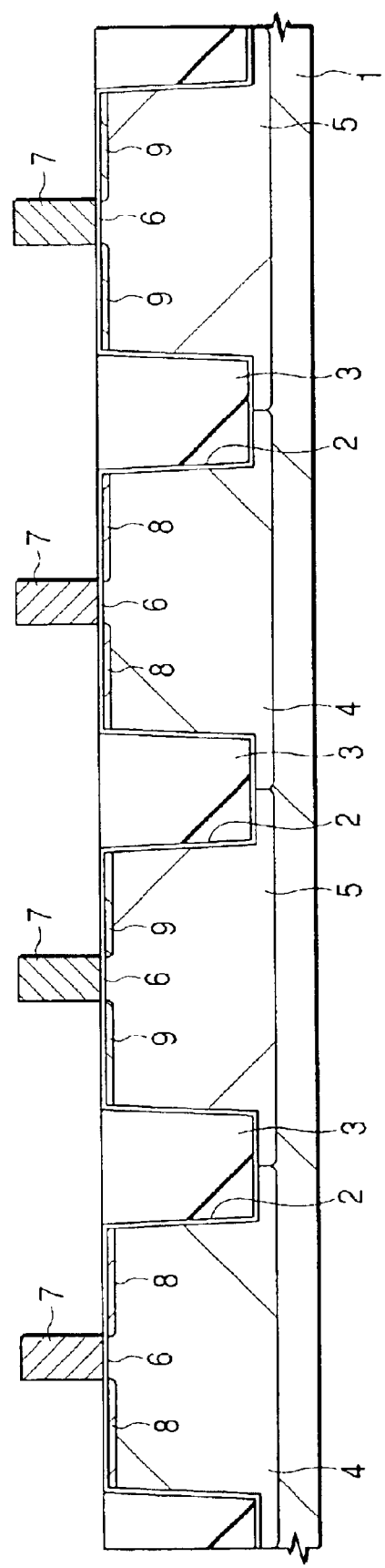

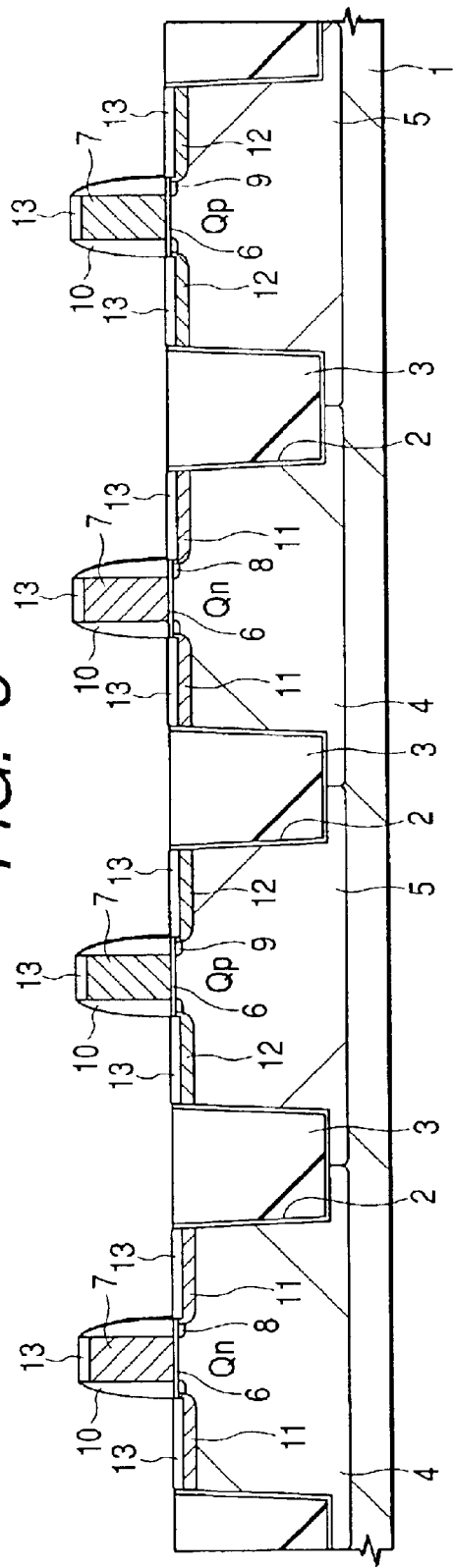
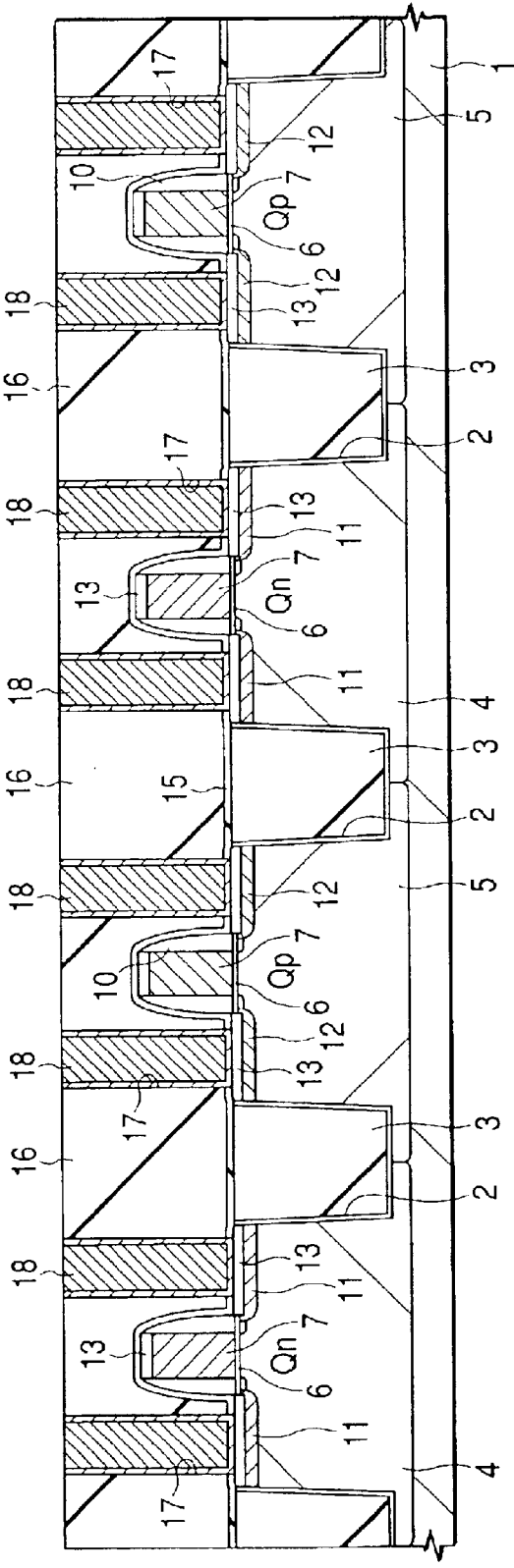

FABRICATION METHOD OF SEMICONDUCTOR INTEGRATED CIRCUIT DEVICE

BACKGROUND OF THE INVENTION

The present invention relates to a technique on fabrication of a semiconductor integrated circuit device, particularly a technique effective for the formation of a copper interconnection, using Damascene process.

In recent processes of fabricating a semiconductor integrated circuit device wherein circuits are made highly fine and integrated to a very high degree, element-isolating trenches are made in a silicon substrate or contact holes are made in self-alignment to gate elements of metal insulator semiconductor field effect transistors (MISFETs), for example, by using a difference in etching speed between different kinds of insulating films, such as a silicon oxide film and a silicon nitride film.

Japanese Patent Unexamined Publication No. Hei 10(1998)-321838 discloses a technique of depositing a silicon oxide film across a silicon carbide (SiC) film over a gate electrode to which a side wall spacer made of a silicon oxide film or a silicon nitride film is fitted, thereby making contact holes in self-alignment to the gate electrode. For dry etching of the silicon oxide film, a hydrofluorocarbon gas or a fluorocarbon gas, such as $CF_4$, $CHF_3$ or $C_4F_8$, is used. When such a gas is used, the silicon carbide film, which is not easily etched, functions as an etching stopper for preventing the material of the gate electrode or the side wall spacer from being etched. In order to remove the silicon carbide film exposed to the bottom of the contact hole, plasma treatment using a mixed gas of $CF_4$ and oxygen ($O_2$) is utilized. When this plasma treatment is conducted, the silicon carbide film is converted to a silicon oxide film by the action of oxygen in the mixed gas and the film is removed by fluorine radicals and ions generated from $CF_4$ in the mixed gas.

Japanese Patent Unexamined Publication No. Hei 7(1995)-161690 discloses a technique in which at the time of supplying a mixed gas of a fluorine-based gas (for example, $SF_6$, $CF_4$ or $NF_3$) and oxygen into a vacuum chamber wherein a silicon carbide substrate is arranged over an electrode and plasma is generated between the electrode and a counter electrode to etch the silicon carbide substrate with reactive ions, the substrate is arranged over the electrode in the state that the substrate is put on a plate which has a size approximated to the area of the electrode and is made of quartz glass or silicon. According to this method, the electrode, which has a larger area than the substrate, is covered with the plate; therefore, the material of the electrode (for example, aluminum) is prevented from being sputtered. Thus, it is possible to avoid a micromask phenomenon (a phenomenon that the electrode material is sputtered to adhere onto the surface of the substrate, thereby disturbing the advance of etching), which follows the sputtering.

Japanese Patent Unexamined Publication No. 2000-355779 relates to an anticorrosion member of an etching machine, and discloses a technique in which the surface of a member exposed to an etching gas having an intense corrosiveness, such as chlorine-based or fluorine-based plasma gas, is covered with a silicon carbide film whose (1 1 1) plane is oriented in parallel to the member surface, the film being made of polycrystal of a 3C crystal system, in order to make anticorrosion of the member high.

As a means for preventing etched-shape defects (such as a reversely-tapered shape and undercut) at the time of dry-etching a multilayered film wherein different kinds of films, such as a silicon oxide film, a silicon nitride film and an amorphous silicon film, are stacked, Japanese Patent Unexamined Publication No. Hei 6(1994)-208977 discloses a technique in which a mixed gas of $CF_4$ and oxygen is used to dry-etch the multilayered film and subsequently $SF_6$ gas or a mixed gas of $SF_6$ and oxygen is used to dry-etch the multilayered film further in order to correct the defects of the etched shape.

Japanese Patent Unexamined Publication No. Hei 7(1995)-235525 discloses a technique of introducing a fluorine-containing gas excited in a different space into a container of a dry etching machine containing a substrate to be treated from a first gas introducing port, and introducing a gas which contains a halogen element other than fluorine into the container from a second gas introducing port to perform etching, thereby etching a silicon nitride film over the substrate to be treated at a higher selective ratio (i.e., selectivity) than the selective ratio at which a silicon oxide film is etched.

Japanese Patent Unexamined Publication No. Hei 5(1993)-326499 discloses a technique in which at the time of patterning a silicon nitride film used as an anti-oxidizing mask in LOCOS oxidization, an etching gas in which a gas for heightening an etching selective ratio of silicon nitride to resists and silicon oxide (for example, HBr or oxygen gas) is added to $N_3$ as a main etchant and is used to prevent side faces of the silicon nitride film from being forward-tapered, thereby suppressing bird's beak at end portions of field insulating films, which becomes a problem in LOCOS oxidization.

Japanese Patent Unexamined Publication No. Hei 5(1993)-267246 discloses a technique in which at the time of patterning a silicon nitride film by reactive ion etching using a resist pattern as a mask, the following gas is used as an atmosphere gas for the etching to increase the etching selective ratio of the silicon nitride film to the resist: a first etching gas wherein $SF_6$, HBr, He and oxygen are mixed, or a second etching gas wherein any one selected from nitrogen, flon gas, $NF_3$ and inert gas is mixed with the first etching gas.

Japanese Patent Unexamined Publication No. 2001-210627 discloses a technique of using an etching gas containing fluorine, carbon and nitrogen in order to plasma-etch satisfactorily an organic/inorganic hybrid film represented by SiCxHyOz and formed across an etching stopper film made of silicon carbide over interconnections made of aluminum or copper.

SUMMARY OF THE INVENTION

In recent years, interconnections have become very fine by a great rise in the integration degree of LSIs. Following this, an increase in interconnection resistance has become remarkable. Particularly in high-performance logic LSIs, the increase in interconnection resistance is a great factor of blocking a further improvement in the performance thereof. In order to solve this problem, the introduction of embedded Cu interconnections using the so-called Damascene process has been proposed, that is, a process of making interconnection grooves in an interlayer insulating film over a silicon substrate depositing a Cu film on the interlayer insulating film including the inside space of the interconnection grooves, and removing the Cu film unnecessary outside the interconnection grooves by chemical mechanical polishing (CMP). Moreover, in order to promote a rise in the performance of logic LSIs by lowering the interconnection capacity thereof, the introduction of an interlayer insulating film made of an organic polymer-based insulating film material having a lower dielectric constant than a silicon oxide film has been advanced in parallel to the introduction of the above-mentioned Cu interconnections.

In an ordinary process in which interconnection grooves are made in an interlayer insulating film made of the above-mentioned organic polymer-based insulating film material and then Cu interconnections are formed inside the grooves, a diffusion barrier layer is first deposited on the underlying Cu interconnections, and subsequently an interlayer insulating film is deposited on the diffusion barrier layer. The diffusion barrier layer is formed in order to prevent Cu in the underlying Cu interconnections from diffusing into the organic insulating film. The diffusion barrier layer is made of, for example, a silicon nitride film. In order to reduce interconnection capacity, it is desired to use silicon carbide having a smaller dielectric constant (=4.3 to 4.5) than a silicon nitride film (dielectric constant=7).

Next, by dry-etching the organic insulating film and the diffusion barrier layer underlying it, interconnection grooves wherein the underlying Cu interconnections are exposed to its bottom are formed. Subsequently, a Cu film is deposited on the organic insulating film including the inside space of the interconnection grooves. Thereafter, the Cu film unnecessary on the organic insulating film is removed by chemical mechanical polishing, whereby Cu interconnections are formed inside the interconnection grooves.

When the inventors dry-etched the silicon carbide film constituting the diffusion barrier layer, the inventors used a mixed gas of Ar, oxygen and a hydrofluorocarbon gas (or a fluorocarbon gas) such as $CF_4$, $CHF_3$ or $C_4F_8$. However, the following defects were generated: an insulating reactant adhered to the surface of the underlying Cu interconnections exposed to the bottom of the interconnection grooves and further the silicon carbide film or the organic insulating film exposed to side walls of the interconnection grooves was side-etched.

An object of the present invention is to provide a technique making it possible to suppress the following defects: when an interlayer insulating film including a silicon carbide film and an organic insulating film is dry-etched to form interconnection grooves over underlying Cu interconnections, an insulating reactant adheres to the surface of the underlying Cu interconnections exposed to the bottom of the interconnection grooves and further the silicon carbide film or the organic insulating film exposed to side walls of the interconnection grooves is side-etched.

The above-mentioned object of the present invention and other objects thereof, and new features thereof will be apparent from the description of the present specification and attached drawings.

The summary of a typical aspect of the present invention will be briefly described as follows.

(1) The process of fabricating a semiconductor integrated circuit device of the present invention comprises the steps of:
  (a) forming a conductive layer containing copper as a main component over a main face of a semiconductor substrate,
  (b) forming a first insulating film containing silicon carbide as a main component over the conductive layer, and
  (c) using a mixed gas of $SF_6$ and $NH_3$ to dry-etch a portion of the first insulating film, thereby making an opening wherein the surface of the conductive layer is exposed to its bottom.

(2) The process of fabricating a semiconductor integrated circuit device of the present invention comprises the steps of:
  (a) forming a conductive layer containing copper as a main component over a main face of a semiconductor substrate,
  (b) forming a first insulating film containing silicon nitride as a main component over the conductive layer, and
  (c) using a mixed gas of $SF_6$, HBr and $N_2$ or a mixed gas of $SF_6$, HBr and $NH_3$ to dry-etch a portion of the first insulating film, thereby making an opening wherein the surface of the conductive layer is exposed to its bottom.

BRIEF DESCRIPTION OF THE DRAWINGS

FIG. 1 is a sectional view of a principal portion of a semiconductor substrate illustrating a process of fabricating a semiconductor integrated circuit device which is an embodiment of the present invention.

FIG. 2 is a sectional view of a principal portion of the semiconductor substrate illustrating the process of fabricating the semiconductor integrated circuit device which is the embodiment of the present invention.

FIG. 3 is a sectional view of a principal portion of the semiconductor substrate illustrating the process of fabricating the semiconductor integrated circuit device which is the embodiment of the present invention.

FIG. 4 is a sectional view of a principal portion of the semiconductor substrate illustrating the process of fabricating the semiconductor integrated circuit device which is the embodiment of the present invention.

DETAILED DESCRIPTION OF THE PREFERRED EMBODIMENTS

Figure 5:
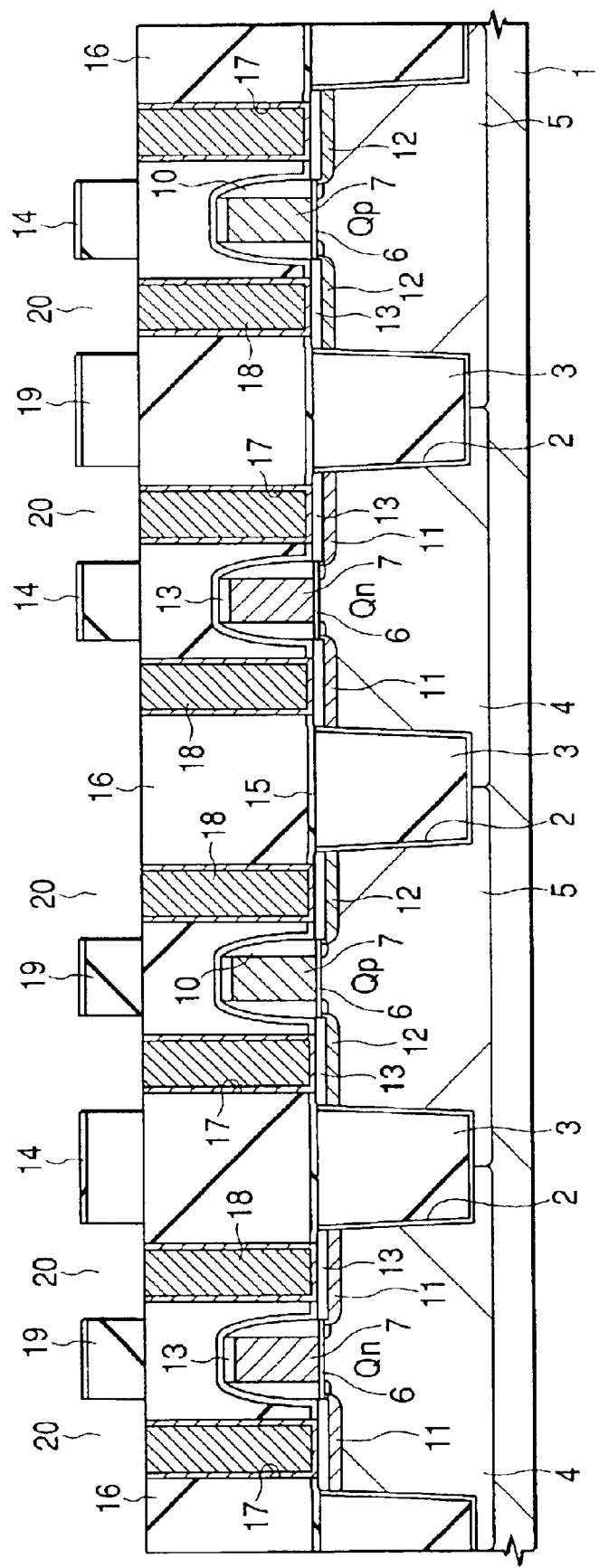
FIG. 5 is a sectional view of a principal portion of the semiconductor substrate illustrating the process of fabricating the semiconductor integrated circuit device which is the embodiment of the present invention.

Referring to the drawings, embodiments of the present invention will be described in detail hereinafter. In all the drawings, the same reference numbers are attached to the same members therein and repeated description thereof is omitted.

If necessary for convenience, each of the following embodiments will be divided to plural sections or forms and will be described. These are related to each other and one thereof is a modified example, a detailed description, a supplementary description or the like of the other or others unless otherwise described.

When a number about elements (for example, the number of the elements, numerical values, quantity, and upper and lower limits of a range) is specifically described in the following embodiments, the specific number is not restrictive and a number over or below the specific number may be applied except the case in which the matter that the specific number is restrictive is stated or the case in which the specific number is clearly restrictive from the viewpoint of an applied principle. In the following embodiments, a constituent (for example, an element, or a step) thereof is not essential except the case in which the matter that the constituent is essential is stated or the case in which the constituent is clearly essential from the viewpoint of an applied principle.

Description on a constituent (for example, a gas, an element, a molecule, and a material) does not exclude other constituents except the case in which the matter that other constituents cannot be used is stated or the case in which it is clear that other constituents cannot be used from the viewpoint of an applied principle. Therefore, for example, in the case in which a specified combination of gases is referred to as an etchant or an etching gas for treating a wafer but other gases are not referred to, the use of other etching gases, rare gases such as argon and helium, or other adding or adjusting gases is not excluded.

When the shape, the positional relationship, or the like of a constituent or the like is referred to in the following embodiments, analogs of the shape or the like may be used except the case in which the matter that other shapes or the like cannot be used is stated or the case in which it is clear that other shapes or the like cannot be used from the viewpoint of an applied principle. This matter is also true about the above-mentioned number about elements.

A semiconductor integrated circuit device referred to in the present application may be a semiconductor integrated circuit device fabricated on a monocrystal silicon substrate, or a semiconductor integrated circuit device fabricated on some other substrate, such as an SOI (silicon on insulator) substrate or a TFT (thin film transistor) liquid crystal producing substrate, except the case in which the matter that the device is limited to a specified kind is stated. A wafer means a monocrystal silicon substrate, which is generally in a disc form, used in the fabrication of a semiconductor integrated circuit device, an SOS substrate, a glass substrate, some other insulating, semi-insulating or semiconductor substrate, or a composite substrate thereof.

Embodiment 1

A process of fabricating a CMOS-LSI, which is an embodiment of the present invention, will be described in order of steps thereof, referring to FIGS. 1 to 15.

As illustrated in FIG. 1, first, element-isolating grooves 2 are made in a semiconductor substrate (hereinafter referred to as a substrate or a wafer) made of p-type monocrystal silicon having a resistivity of, for example, about 1 to 10 Ωcm. The element-isolating grooves 2 are made by etching element-isolating regions in the substrate 1 to make grooves, depositing a silicon oxide film 3 on the substrate 1 including the inside space of the grooves by CVD and subsequently polishing the silicon oxide film 3 outside of the grooves chemically and mechanically.

Next, boron is ion-implanted into some parts of the substrate 1, and phosphorous is ion-implanted into some other parts thereof to form p-type wells 4 and n-type wells 5. Thereafter, the substrate 1 is subjected to steam-oxidization to form a gate oxidized film 6 on each of surfaces of the p-type wells 4 and the n-type wells 5.

Next, as illustrated in FIG. 2, gate electrodes 7 are formed over the p-type wells 4 and the n-type wells 5. The gate electrodes 7 are formed, for example, by depositing a polycrystal silicon film on the gate oxidized film 6 by CVD, ion-implanting phosphorous into the polycrystal silicon film on the p-type wells 4, ion-implanting boron into the polycrystal silicon film on the n-type wells 5, and patterning the polycrystal silicon film by dry-etching using a photoresist film as a mask.

Next, phosphorous or arsenic is ion-implanted into the p-type wells 4, to form $n^-$-type semiconductor regions 8 having a low impurity concentration. Boron is ion-implanted into the n-type wells 5 to form $p^-$-type semiconductor regions 9 having a low impurity concentration.

Next, as illustrated in FIG. 3, a silicon nitride film is deposited on the substrate 1 by CVD and subsequently this silicon nitride film is anisotropically etched to form side wall spacers 10 on side walls of the gate electrodes 7. Thereafter, phosphorous or arsenic is ion-implanted into the p-type wells 4 to form $n^+$-type semiconductor regions 11 (sources and drains) having a high impurity concentration. Boron is ion-implanted into the n-type wells 5 to form $p^+$-type semiconductor regions 12 (sources and drains) having a high impurity concentration.

Next, the surface of the substrate 1 is washed and then a silicide layer 13 is formed on each surface of the gate electrodes 7, the $n^+$-type semiconductor regions 11 (sources and drains), and the $p^+$-type semiconductor regions 12 (sources and drains). The silicide layer 13 is formed by depositing a Co (cobalt) film on the substrate 1 by sputtering, performing heat treatment in the atmosphere of nitrogen gas to react the substrate 1 and the gate electrodes 7 with the Co film, and removing the Co film which has been unreacted by wet etching. By the above-mentioned steps, n-channel type MISFETs Qn and p-channel type MISFEs Qp are completed.

Next, as illustrated in FIG. 4, a silicon nitride film 15 and a silicon oxide film 16 are deposited on the substrate 1 by CVD. Subsequently, the silicon oxide 16 and the silicon nitride film 15 on the $n^+$-type semiconductor regions 11 (sources and drains) and those on the $p^+$-type semiconductor regions 12 (sources and drains) are dry-etched to make contact holes 17. Thereafter, metal plugs 18 are formed inside the contact holes 17. When the silicon oxide film 16 is etched, the following is used in order to make the etching rate of the underlying silicon nitride film 15 small: a hydrofluorocarbon gas or a fluorocarbon gas, such as $CF_4$, $CHF_3$ (an acyclic fluorocarbon having 2 or less carbon atoms, or a fluorine-based etchant), or $C_4F_8$ (a cyclic fluorocarbon having 3 or more carbon atoms, a cyclic fluorine-based etchant, an acyclic fluorocarbon, a chain-form fluorocarbon fluorine-based etchant, or the like may be used). When the silicon nitride film 15 is etched, a mixed gas wherein oxygen and Ar (diluting gas) are added to a hydrofluorocarbon gas (such as $CHF_3$ or $CH_2F_2$) is used. The metal plugs 18 are formed by depositing a TiN (titanium nitride) film and a W (tungsten) film on the silicon oxide film 16 including the inside space of by CVD and then removing the TiN film and the W film unnecessary on the silicon oxide film 16 by chemical mechanical polishing (CMP) or etch back process. The silicon oxide film 16 may be made of a silicon oxide film formed by ordinary CVD using monosilane ($SiH_4$) as a source gas, a BPSG (boron-doped phospho silicate glass) film, an SOG (spin on glass) film formed by spin coating process, or the like film.

Next, as illustrated in FIG. 5, an organic insulating film 19 and a silicon oxide film 14 are deposited on the silicon oxide film 16, and then the silicon oxide film 14 and the organic insulating film 19 are dry-etched using a photoresist as a mask to form interconnection grooves 20 over the contact holes 17.

The organic insulating film 19 is made of an insulating material having a small dielectric constant than silicon oxide (dielectric constant=4.7) in order to reduce interconnection capacity. Examples of such a low dielectric constant (Low-k) insulating material include organic coating films (completely organic type insulating films) formed by spin coating, such as "SiLK" (an aromatic polymer made by The Dow Chemical Co. in USA, dielectric constant=2.7), and "FLARE" (polyallyl ether (PAE) made by Honeywell Electronic Materials Co. in USA, dielectric constant=2.8). The silicon oxide film 14 functions as an etching stopper layer.

Figure 6:
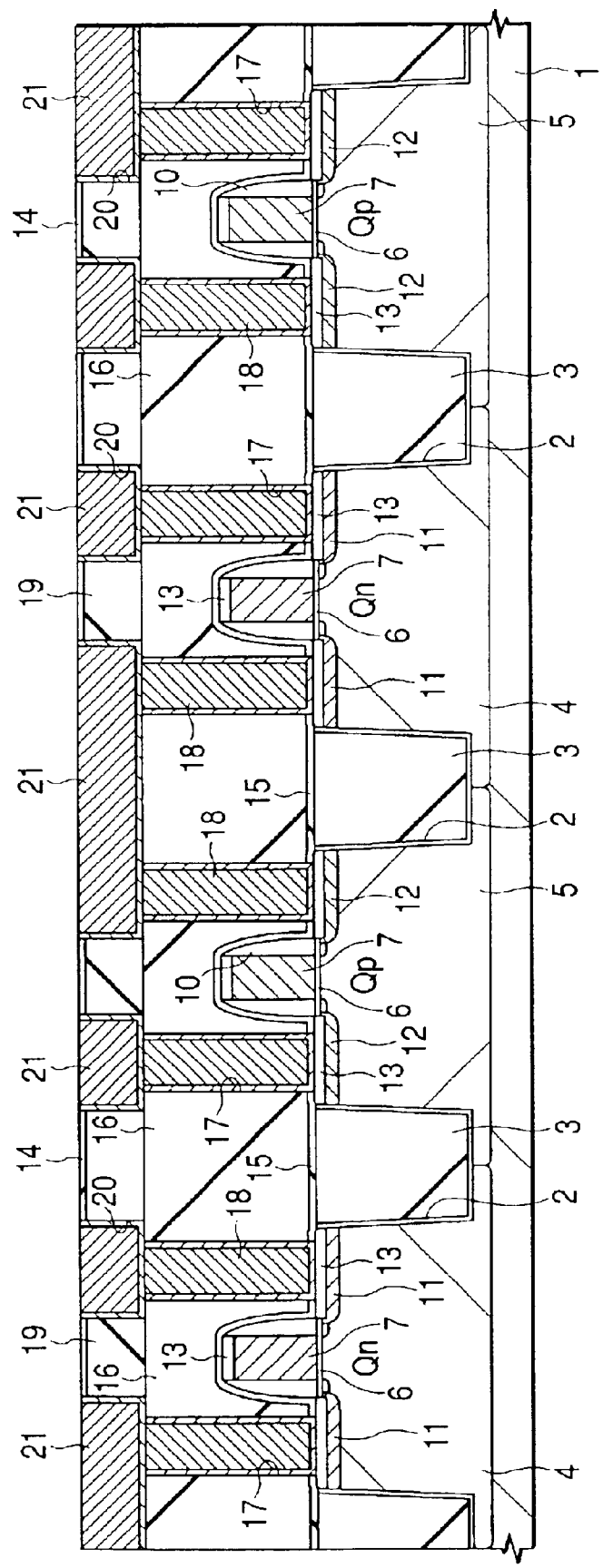
FIG. 6 is a sectional view of a principal portion of the semiconductor substrate illustrating the process of fabricating the semiconductor integrated circuit device which is the embodiment of the present invention.

Next, as illustrated in FIG. 6, a Cu interconnection 21 as a first layer is formed inside each of the interconnection grooves 20. The Cu interconnection 21 is made of a lamination film of a barrier metal layer and a Cu film, and is formed by a method as described in the following. First, the barrier metal film and the Cu film are deposited on the silicon oxide film 14 including the inside space of the interconnection groove 20. Subsequently, heat treatment (reflow) is conducted in a non-oxidizing atmosphere (for example, a hydrogen atmosphere) to embed the Cu film compactly in the interconnection groove 20. Thereafter, the Cu film and the barrier metal film unnecessary outside the interconnection groove 20 are removed by chemical mechanical polishing. In order to polish the Cu film and the barrier metal film, there is used, for example, a polishing slurry wherein abrasive grains (made of alumina or the like) and an oxidizer (such as hydrogen peroxide water or aqueous iron (III) nitrate solution) as main components are dispersed or dissolved into water.

The barrier metal film has a function of preventing Cu in the Cu interconnection 21 from diffusing into the organic insulating film 19, a function of improving adhesiveness between the Cu interconnection 21 and the organic insulating film 19 and a function of improving wettability of the Cu film when the Cu film is subjected to reflow. Examples of the barrier metal film having such functions include a high melting point metal nitride film, such as a TiN film, a WN (tungsten nitride) film or a TaN (tantalum nitride) film deposited by sputtering, and a lamination film thereof.

The Cu film is formed by any one of sputtering, CVD and plating (electroplating or electroless plating) In the case of forming the Cu film by plating, a seed layer made of a thin Cu film is beforehand formed on the surface of the barrier metal film by sputtering or the like and then the Cu film is grown on the surface of this seed layer. In the case of forming the Cu layer by sputtering, it is preferred to use sputtering which gives a high directivity, such long throw sputtering or collimate sputtering. The Cu film may be made of a simple substance of Cu, or a Cu alloy made mainly of Cu.

Figure 7:
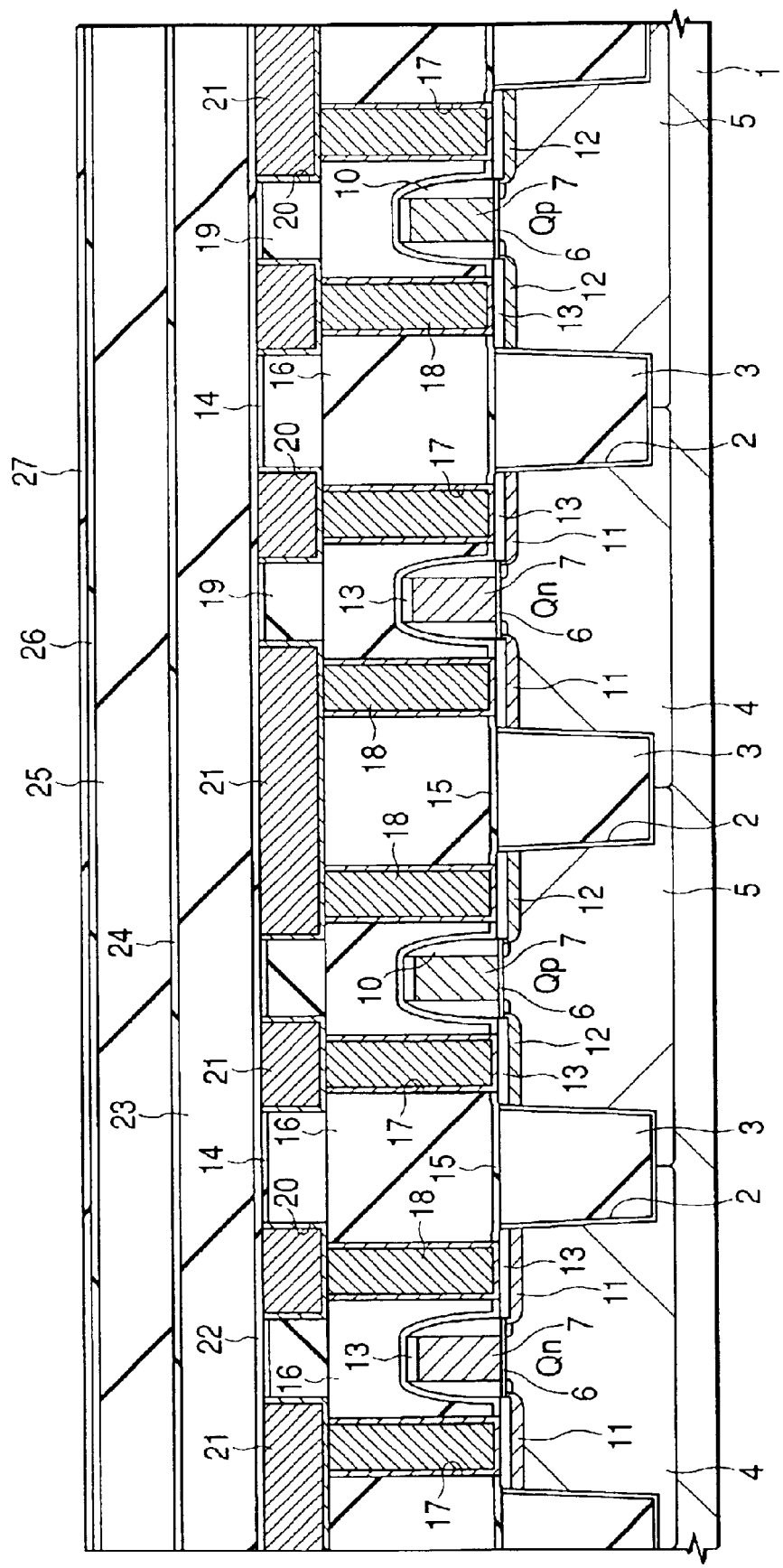
FIG. 7 is a sectional view of a principal portion of the semiconductor substrate illustrating the process of fabricating the semiconductor integrated circuit device which is the embodiment of the present invention.

Next, as illustrated in FIG. 7, the following are successively on the Cu interconnections 21: a silicon carbide film 22, an organic insulating film 23, a silicon oxide film 24, an organic insulating film 25, a silicon oxide film 26 and a silicon carbide film 27. The silicon oxide films 24 and 26 are deposited by CVD. As the organic insulating films 23 and 25, an insulating material having a smaller dielectric constant than silicon oxide, for example, the above-mentioned "SiLK" or "FLARE" is deposited by spin coating. As the silicon carbide films 22 and 27, there is used, for example, "BLOk" (silicon carbide made by Applied Materials Co. in USA, dielectric constant=4.3). The "BLOk" is deposited by plasma CVD using a mixed gas of trimethylethoxysilane and nitrogen as a source gas.

The silicon carbide film 22 lying between the Cu interconnections 21 and the organic insulating film 23 functions as a diffusion barrier layer for preventing Cu in the Cu interconnections 21 from diffusing into the organic insulating film 23. As the barrier layer for preventing the diffusion of Cu, a silicon nitride film may be used. However, by using silicon carbide having a small dielectric constant than silicon nitride (dielectric constant=7), interconnection capacity can be reduced. The silicon oxide films 24 and 26 function as etching stoppers when the interconnection grooves are made in the organic insulating films 23 and 25. The silicon carbide film 27 as the topmost layer functions as a hard mask for preventing, when the silicon oxide film 24 is etched, the overlying silicon oxide film 26 from being etched. As the etching stopper layer, a siloxane (SiO)-based insulating film, which will be described later, or a silicon carbide film may be used instead of the silicon oxide films 24 and 26.

Next, the lamination film composed of the silicon carbide film 27, the silicon oxide film 26, the organic insulating film 25, the silicon oxide film 24, the organic insulating film 23 and the silicon carbide film 22 is dry-etched to form interconnection grooves. Subsequently, Cu interconnections as a second layer, which are electrically connected to the Cu interconnections 21 as the first layer, are made inside the interconnection grooves.

The inventors made the following experiment when the lamination film was dry-etched.

First, a mixed gas of $C_4F_8$, Ar and oxygen was used as an etching gas for the silicon oxide film, and a mixed gas containing nitrogen and hydrogen was used as an etching gas for the organic insulating film. A mixed gas of Ar, oxygen and a hydrofluorocarbon gas (or fluorocarbon gas) such as $CF_4$, $CHF_3$ or $C_4F_8$ was used as an etching gas for the silicon carbide film. In this way, the inventors tried to dry-etch the lamination film to form interconnection grooves over the Cu interconnections 21.

However, when the mixed gas of the mixed gas of Ar, oxygen and the hydrofluorocarbon gas (or fluorocarbon gas) was used to dry-etch the silicon carbide film 22 as the lowermost layer, the following defects were generated: an insulating reactant adhered to the surface of the Cu interconnections 21 exposed to the bottom of the interconnection grooves and further the silicon carbide film 22 and the organic insulating films 23 and 25 exposed to side walls of the interconnection grooves were side-etched.

The reactant adhering to the surface of the Cu interconnections 21 was made mainly of Cu oxide. It was therefore presumed that the generation of the reactant resulted mainly from the oxidization of the surface of the Cu interconnections 21 by oxygen contained in the etching gas. Next, therefore, a gas wherein oxygen was removed from the above-mentioned mixed gas, that is, a mixed gas of Ar and a hydrofluorocarbon (fluorocarbon gas) was used to dry-etch the silicon carbide film 22. As a result, the Cu interconnections 21 could be prevented from being oxidized. However, a large amount of a deposit made mainly of a fluorocarbon organic substance adhered to the surface of the Cu interconnections 21 and the side walls of the interconnection grooves exposed to the bottom of the interconnection grooves.

Next, the inventors examined a gas species optimal for etching the silicon carbide film on the basis of the above-mentioned experimental results.

Conditions required when the silicon carbide film covering the surface of the Cu interconnections is dry-etched are as follows:

(a) the side walls of the interconnection grooves can be anisotropically etched, that is, the side walls of the interconnection grooves are perpendicularly etched, and (b) a deposit or a reactant is not easily generated on the surface of the Cu interconnections exposed to the bottom of the interconnection grooves.

From the above-mentioned experiment, in order to prevent the reactant from being generated on the surface of the Cu interconnections, it is required to select an etching gas which does not substantially contain oxygen. Any etching gas containing oxygen oxidizes the surface of the Cu interconnections, to generate an insulating reactant. As a result, poor connection is caused between the Cu interconnections made inside the interconnection grooves and the underlying Cu interconnections.

In order to etch the side walls of the interconnection grooves anisotropically or not to adhere any deposit on the surface of the Cu interconnections, it is required to select an etching gas containing both of a gas species for generating a deposit on the side walls of the interconnection grooves and a gas species for etching this side wall deposit. That is, in the case in which no deposit is generated on the side walls of the interconnection grooves in the step of etching, the form of the worked side walls does not become perpendicular since the organic insulating film and the silicon carbide film exposed to the side walls are exposed to gas and side-etched. On the other hand, in the case in which no gas for etching this deposit is present even if a deposit is generated on the side walls, the form of the worked side walls becomes tapered or the deposit is excessively generated on the surface of the Cu interconnections since the film thickness of the deposit becomes larger as the etching advances.

About a large number of gas species, the inventors calculated adsorption characters of ions or radicals generated by decomposition thereof by molecular orbital calculation based on a density functional theory. As a result, it was concluded that optimal for an etching gas satisfying the conditions (a) and (b) is a mixed gas of a first etching gas comprising at least one selected from $SF_6$, HCl, HBr, $Cl_2$, $ClF_3$, and $CF_4$, and a second etching gas comprising at least one selected from $NH_3$, $N_2H_4$, and a mixed gas of $N_2$ and $H_2$.

Any one of the gas species that can be used as the first etching gas is a gas containing, in the molecule thereof, a halogen atom (F, Cl or Br). It can be presumed from this fact that a halogen ion or a halogen radical generated by decomposition of theses gases is bonded to silicon in a silicon carbide molecule to generate a compound having a low vapor pressure, or that the deposit adhering to the side walls of the interconnection grooves is etched. Any one of the gas species that can be used as the second etching gas has a characteristic that nitrogen and hydrogen are contained in the molecule thereof. It can be presumed from this fact that an ion or a radical generated by decomposition of theses gases is bonded to carbon in a silicon carbide molecule to generate an organic compound containing carbon, nitrogen and hydrogen, and this compound adheres, as a deposit, to the side walls of the interconnection grooves. The mixed gas of the first etching gas and the second etching gas does not contain any oxygen; therefore, it is not feared that an oxide is formed on the surface of the Cu interconnections. Furthermore, the mixed gas does not contain any hydrofluorocarbon gas or fluorocarbon gas which can generate a fluorocarbon polymer, such as $CF_4$, $CHF_3$, or $C_4F_8$; therefore, it is not feared that a deposit is excessively formed on the side walls of the interconnection grooves and the surface of the Cu interconnections.

Since $SF_6$ and $CF_4$ among the first etching gas species have the smallest toxicity, they are easily handled. However, $CF_4$ causes a deposit to be easily generated since $CF_4$ contains carbon. Accordingly, $SF_6$ among the first etching gas species can be most easily handled. The toxicity of HCL, HBr, $Cl_2$ and $ClF_3$ becomes weaker in this order. About the second etching gas species, $NH_3$ has a weaker toxicity than $N_2H_4$, and can be more easily handled. The mixed gas of $N_2$ and $H_2$ has no toxicity, but $H_2$ has explosivility. Therefore, among the second gas species, $NH_3$ can be most easily handled. It can be said from the above-mentioned facts that as a gas used when the silicon carbide film covering the surface of the Cu interconnections is dry-etched, a mixed gas of $SF_6$ and $NH_3$ is easy to handle.

The gas used when the silicon carbide film is dry-etched may be a gas wherein a third gas is added to the mixed gas of the first gas and the second gas within the scope that the conditions (a) and (b) are satisfied. It is allowable to add an inert gas such as Ar to the mixed gas of the first etching gas and the second etching gas in order to adjust the concentration or the flow rate of the mixed gas. In this case, however, as the addition amount of the inert gas is larger, the etching speed is lower. When water is added to the mixed gas of the first etching gas and the second etching gas, the etching selective ratio of the silicon carbide film to the silicon oxide film is improved. In this case, however, it is feared that oxygen contained in the water molecules oxidizes the surface of the Cu interconnections. It is therefore preferred that the additional amount of water is such an amount that does not substantially oxidize the surface of the Cu interconnections. In the case in which $NH_3$ or $N_2H_4$ is used as the second etching gas, the ratio between the flows of N and H can finely be adjusted by adding hydrogen and nitrogen thereto.

The following will describe a specific example of the process of dry-etching the lamination film composed of the silicon carbide film 27, the silicon oxide film 26, the organic insulating film 25, the silicon oxide film 24, the organic insulating film 23 and the silicon carbide film 22 to form the interconnection grooves.

Figure 8:
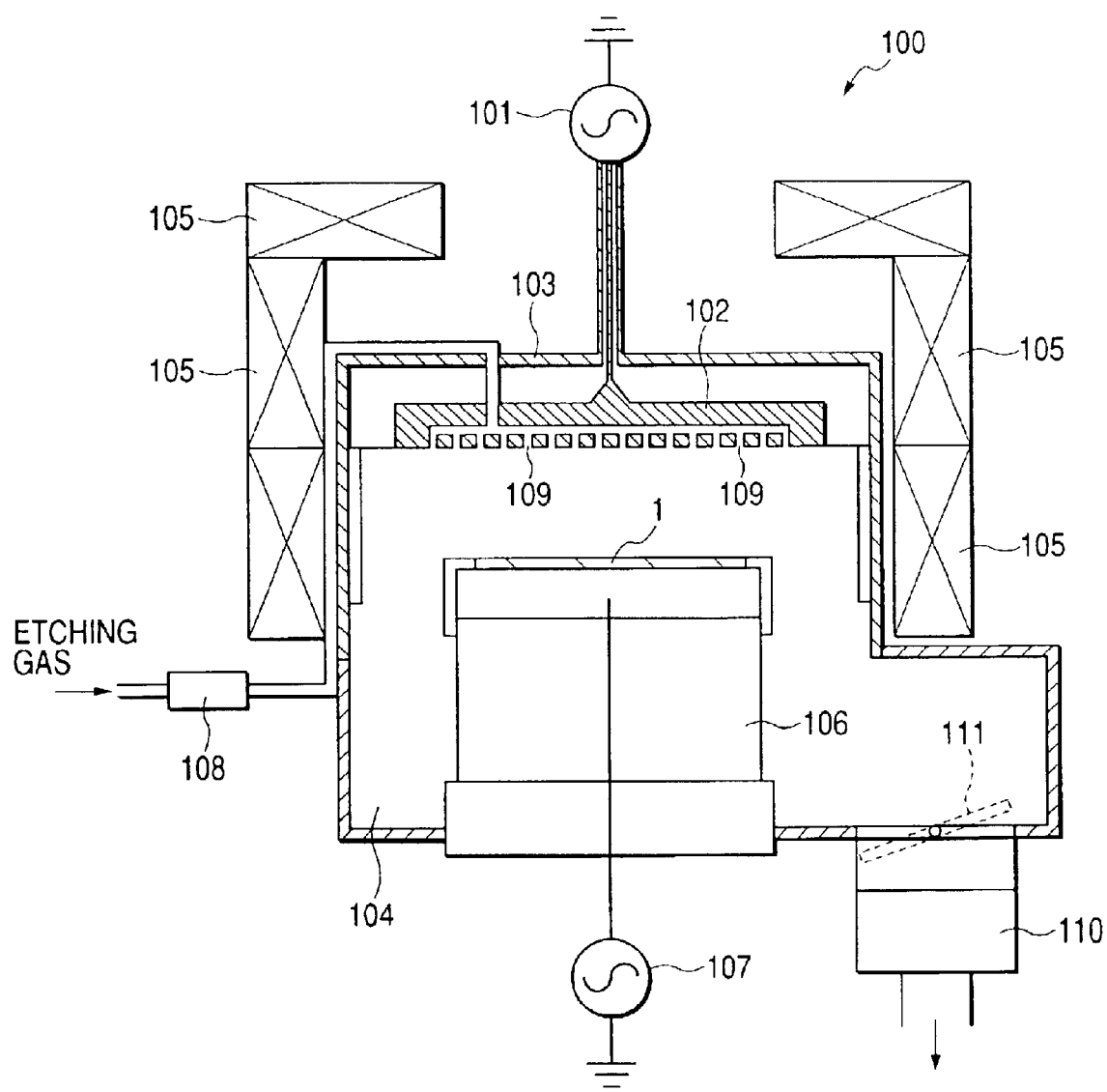
FIG. 8 is a schematic view of a dry etching machine used in the embodiment of the present invention.

FIG. 8 is a schematic view illustrating a dry etching machine 100 used in the formation of the interconnection grooves.

High frequency waves having frequencies of 300 to 900 MHz, generated from a high frequency power source 101, are introduced through an antenna (counter electrode) 102 into a treating chamber 104. The high frequencies resonate between the antenna 102 and an antenna earth 103 near the antenna to be effectively conducted into the treating chamber 104. The high frequencies interact with ECR (electron cyclotron resonance) generated in a solenoid coil 105 arranged around the treating chamber 104 or n axial direction magnetic field above it to generate plasma having a high density ($1 \times 10^{17}/m^3$ or more) at a low pressure of about 0.3 Pa.

A wafer (substrate) 1 is adsorbed or fixed onto the upper face of a stage 106 set up at the center of the treating chamber 104 by means of a non-illustrated chuck mechanism. The interval between the wafer 1 fixed onto the stage 106 and the antenna 102 is set to any value within the range of 20 to 150 mm. High frequency waves having frequencies of 400 kHz to 13.56 MHz, generated from a second high frequency power source 107, are applied to the stage 106 to control the energy of ion injection into the wafer 1 independently of the generation of the plasma. The gas flow rate of the etching gas is made optimal with a gas flow controller 108, and subsequently introduced through a gas introducing inlet 109 into the treating chamber 104 so as to be decomposed by the plasma. Exhaust gas is discharged outside the treating chamber 104 with an exhaust pump 110. The pressure inside the treating chamber 104 is adjusted by opening and shutting of a regulating valve set up in the exhaust system. The temperatures of respective sections contacting the plasma, such as inner walls of the treating chamber 104, the stage 106 and the gas introducing inlet 109, are controlled by a non-illustrated temperature-adjusting device.

Figure 9:
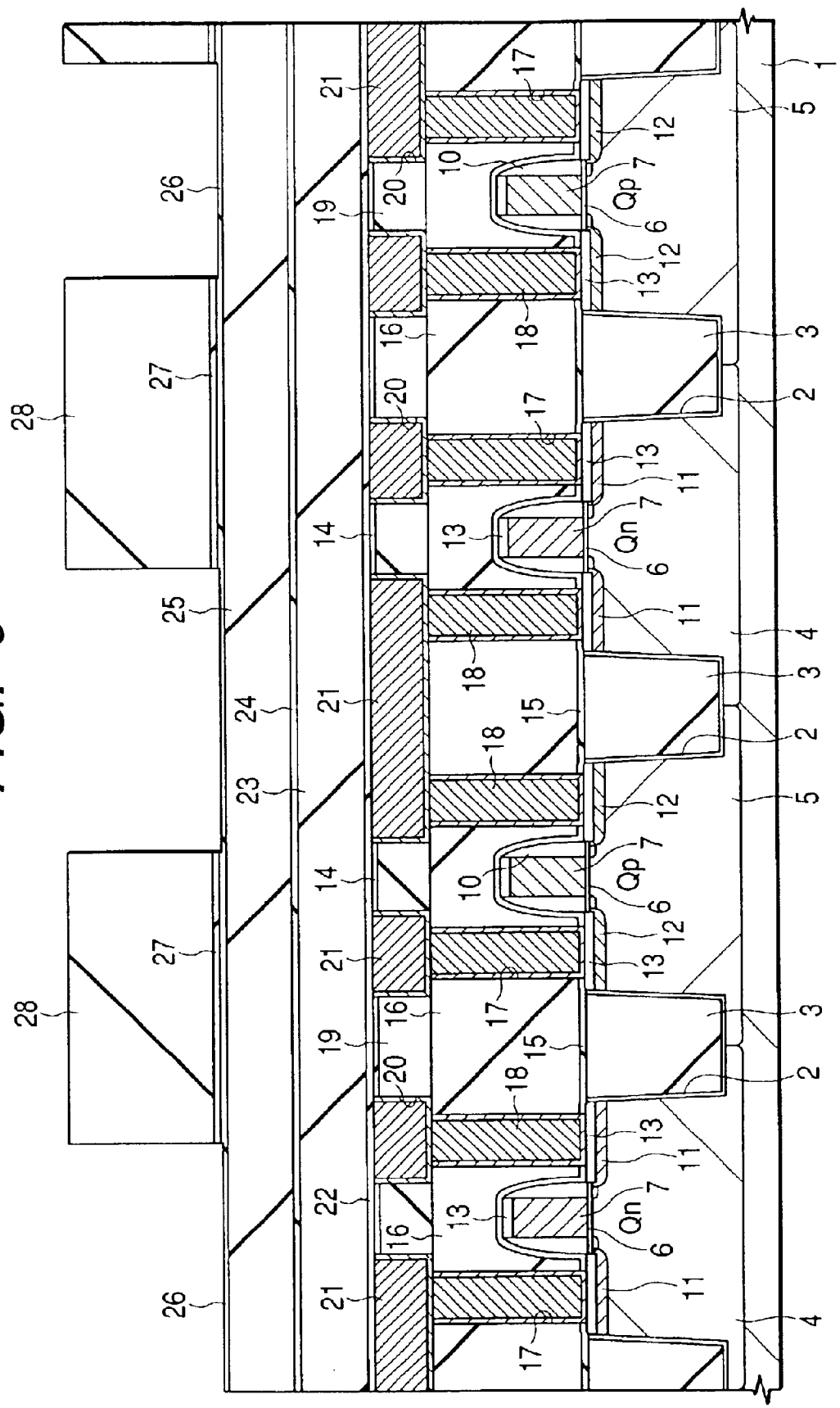
FIG. 9 is a sectional view of a principal portion of a semiconductor substrate illustrating a process of fabricating a semiconductor integrated circuit device which is an embodiment of the present invention.

In order to use the etching machine to form the interconnection grooves, the silicon carbide film 27 in interconnection-forming areas is first removed by dry etching using the photoresist film 28 as a mask, as illustrated in FIG. 9. At this time, by using the mixed gas of $SF_6$ and $NH_3$ as an etching gas, the silicon carbide film 27 is anisotropically etched and further the etching is stopped by the underlying silicon oxide film 26.

Figure 10:
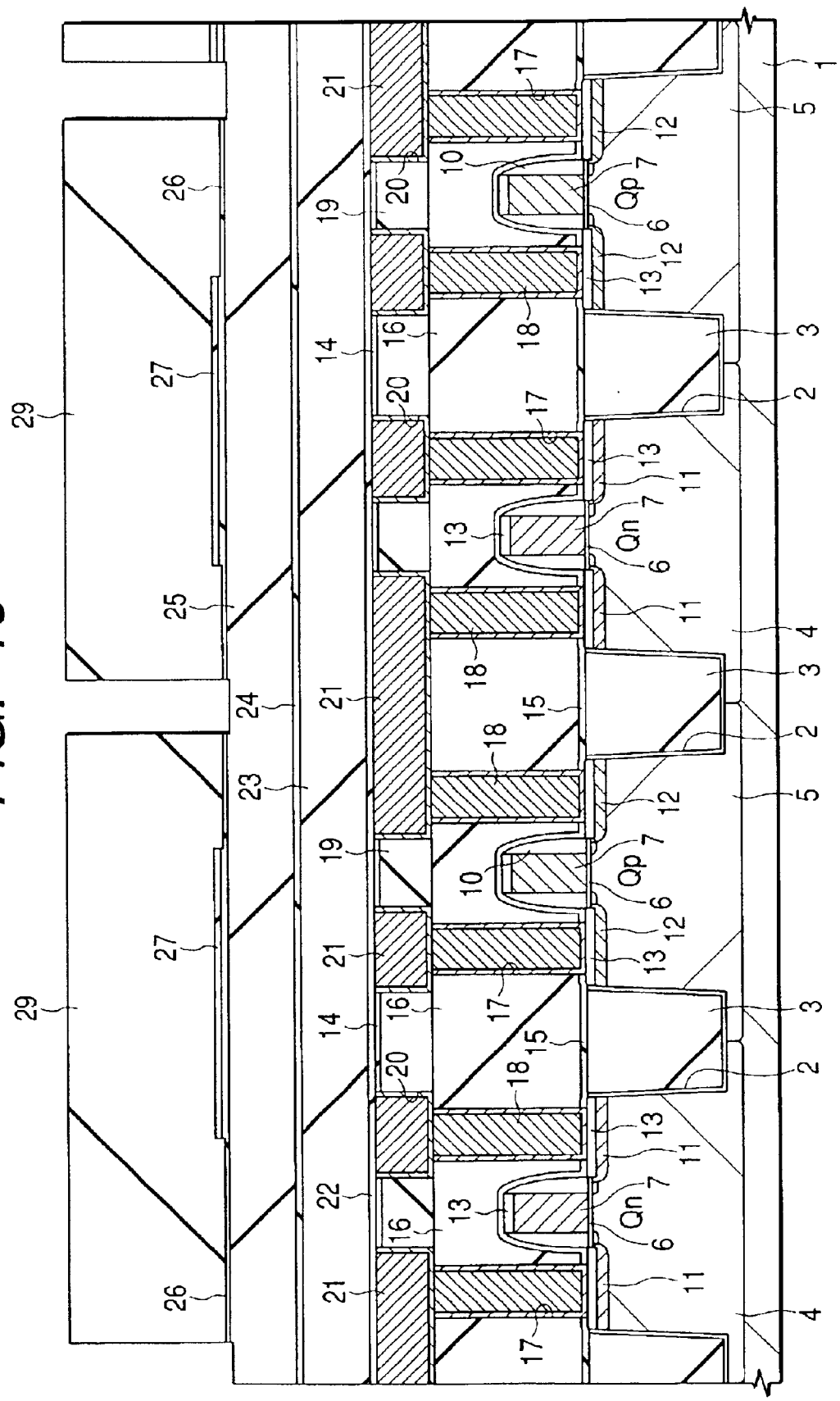
FIG. 10 is a sectional view of a principal portion of the semiconductor substrate illustrating the process of fabricating the semiconductor integrated circuit device which is the embodiment of the present invention.

Next, the photoresist 28 is removed. Subsequently, as illustrated in FIG. 10, the silicon oxide film 26 in some parts of the interconnection-forming areas is removed by dry etching using the photoresist 29 as a mask. At this time, by using the mixed gas of $C_4F_8$, Ar and oxygen as an etching gas, the silicon oxide film 26 is anisotropically etched and further the etching is stopped by the underlying organic insulating film 25.

Figure 11:
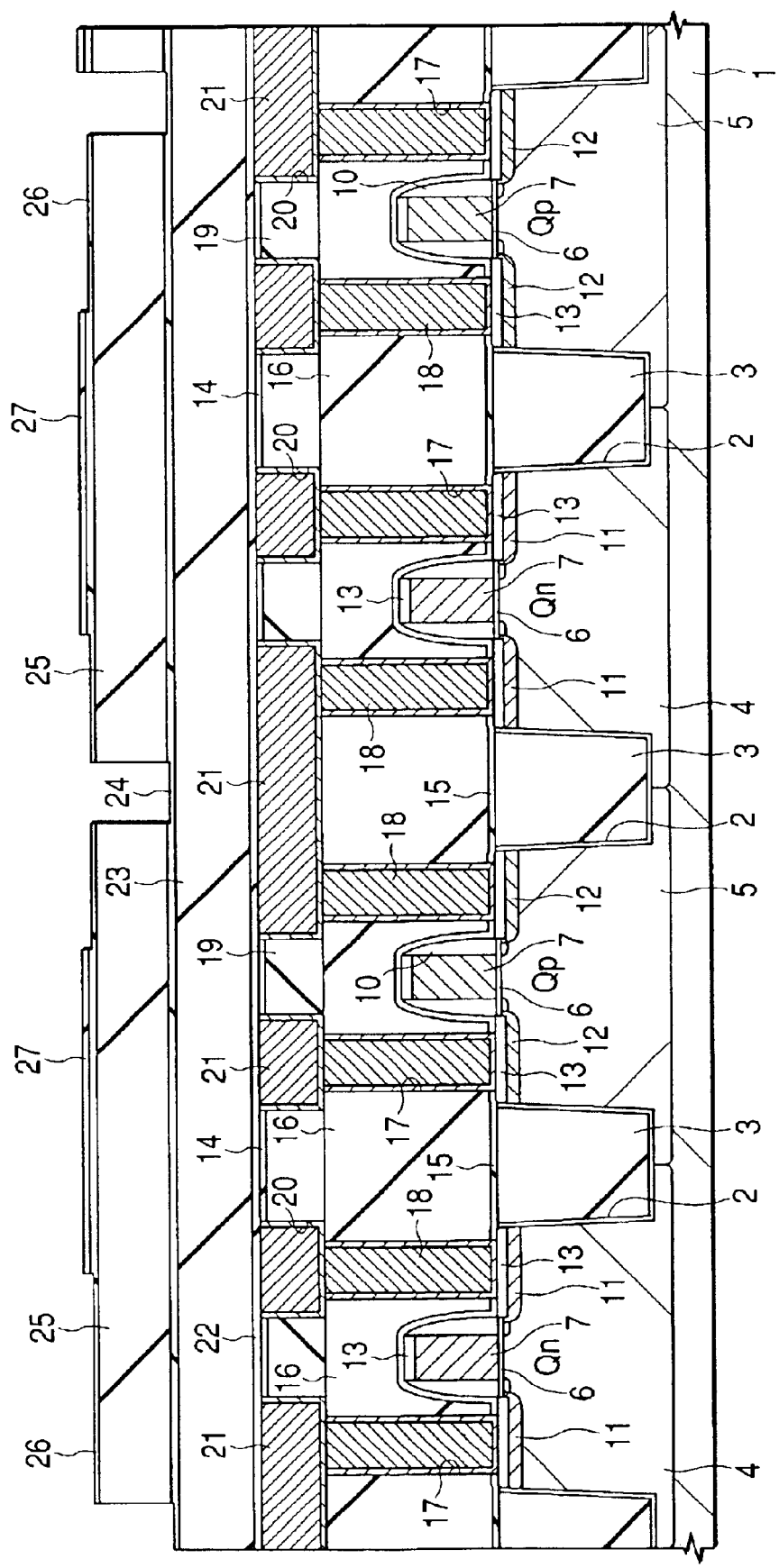
FIG. 11 is a sectional view of a principal portion of the semiconductor substrate illustrating the process of fabricating the semiconductor integrated circuit device which is the embodiment of the present invention.

Next, as illustrated in FIG. 11, the organic insulating film 25 exposed by the above-mentioned etching and the photoresist film 29 are simultaneously dry-etched. At this time, a gas containing nitrogen and hydrogen, such as $NH_3$, $N_2H_4$, or a mixed gas of $N_2$ and $H_2$, is used as an etching gas to etch the organic insulating film 25 anisotropically and further stop the etching by the silicon oxide film 24 underlying the organic insulating film 25, and the silicon carbide film 27 and the silicon oxide film 26 underlying the photoresist film 29.

Figure 12:
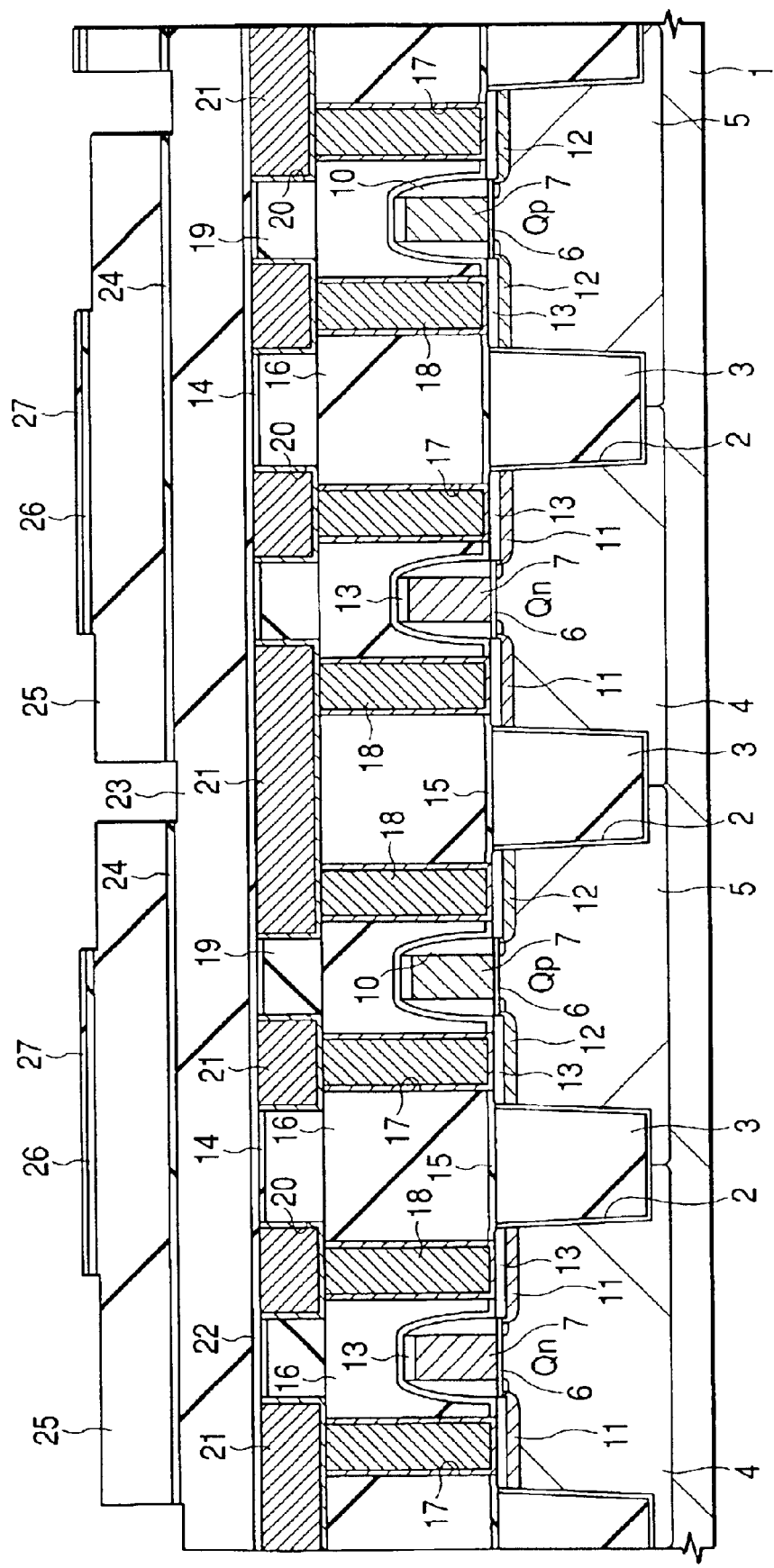
FIG. 12 is a sectional view of a principal portion of the semiconductor substrate illustrating the process of fabricating the semiconductor integrated circuit device which is the embodiment of the present invention.

Next, as illustrated in FIG. 12, the silicon oxide films 24 and 26 exposed by the above-mentioned etching are dry-etched. At this time, a mixed gas of $C_4F_8$, Ar and oxygen is used as an etching gas to etch the silicon oxide films 24 and 26 anisotropically and further stop the etching by the organic insulating film 23 and the silicon carbide film 27.

Figure 13:
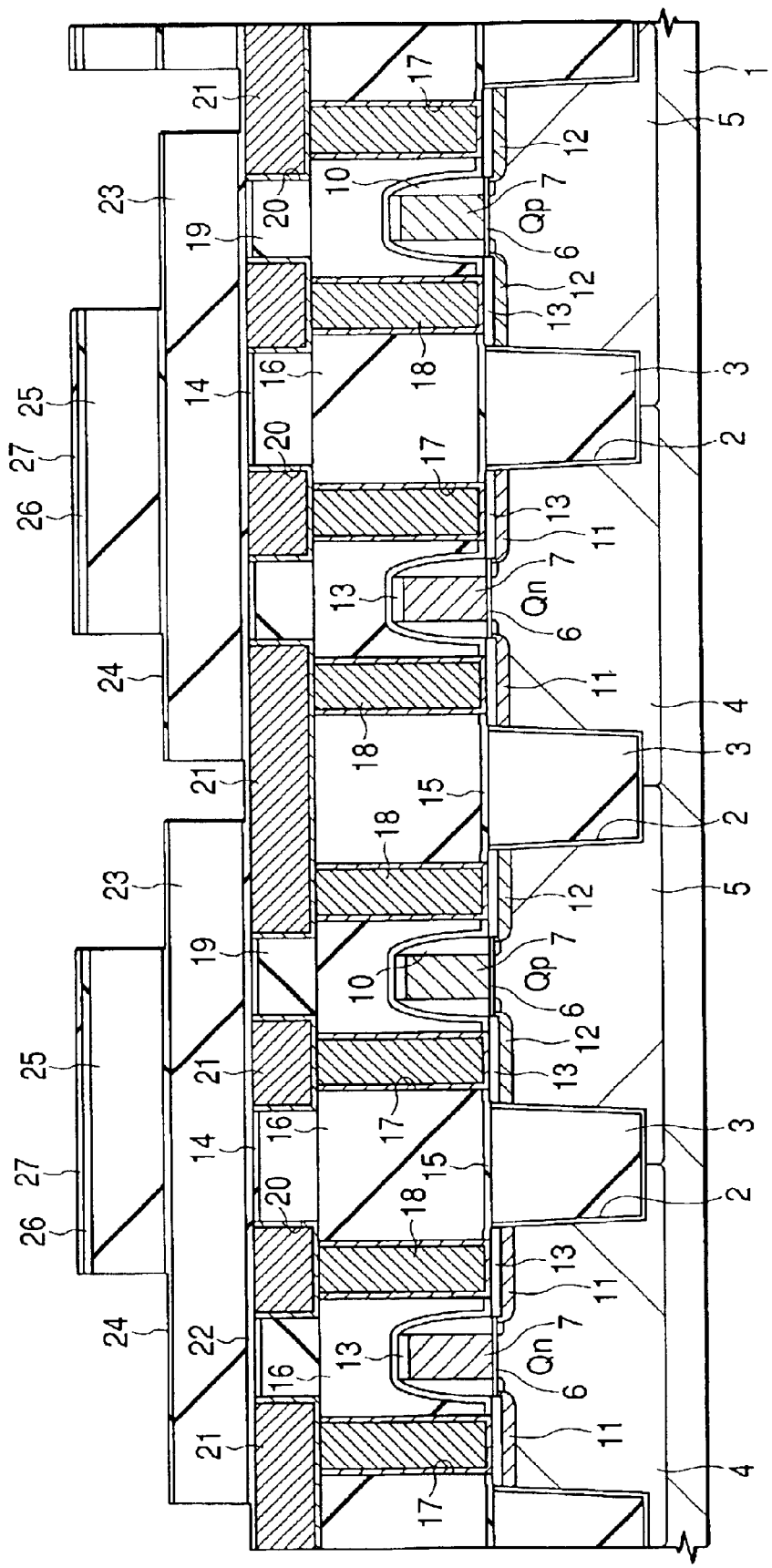
FIG. 13 is a sectional view of a principal portion of the semiconductor substrate illustrating the process of fabricating the semiconductor integrated circuit device which is the FIG. 14 is a sectional view of a principal portion of the semiconductor substrate illustrating the process of fabricating the semiconductor integrated circuit device which is the embodiment of the present invention.

Next, as illustrated in FIG. 13, the organic insulating films 25 and 23 exposed by the above-mentioned etching are dry-etched. At this time, a gas containing nitrogen and hydrogen, such as $NH_3$, $N_2H_4$, or a mixed gas of $N_2$ and $H_2$, is used as an etching gas to etch the organic insulating films 25 and 23 anisotropically and further stop the etching by the silicon oxide film 24 underlying the organic insulating film 25, and the silicon carbide film 22 underlying the organic insulating film 23.

Figure 14:
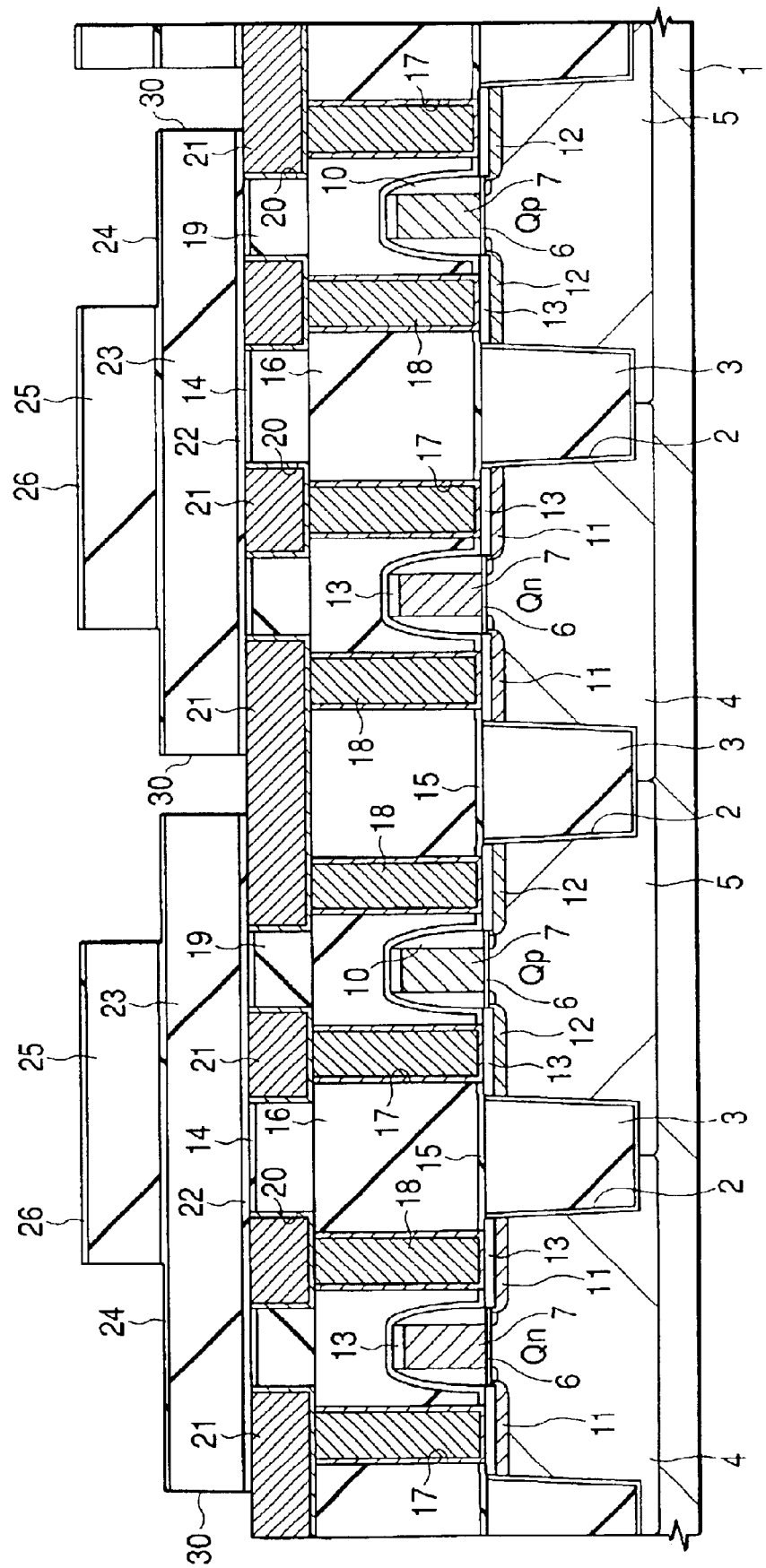

Next, as illustrated in FIG. 14, the silicon carbide film 22 exposed by the above-mentioned etching is dry-etched to expose some parts of the Cu interconnections 21. In this way, the interconnection grooves 30 are made over the Cu interconnections 21. The silicon carbide film 27 as the topmost layer is simultaneously dry-etched to expose the underlying silicon oxide film 26.

At this time, the etching gas used in the dry etching of the silicon carbide films 22 and 27 is the above-mentioned mixed gas of $SF_6$ and $NH_3$. An example of etching conditions is as follows: gas pressure=4 Pa, flow ratio of $SF_6$/$NH_3$=25/25 (ml/minute), high frequency power applied to the counter electrode 102=600 W, high frequency power applied to the stage 106=200 W, and stage temperature=30° C.

The mixed gas is used to dry-etch the silicon carbide films 22 and 27, whereby the side walls of the interconnection grooves 30 are perpendicularly worked and further the etching is stopped by the copper interconnection 21 and the silicon oxide film 26. Additionally, it is possible to suppress defects that a deposit or a reactant adheres to the surface of the Cu interconnections 21 exposed to the bottom of the interconnection grooves 30.

As described above, when the lamination film composed of the silicon carbide film 27, the silicon oxide film 26, the organic insulating film 25, the silicon oxide film 24, the organic insulating film 23 and the silicon carbide film 22 is dry-etched to form the interconnection grooves 30 over the Cu interconnections 21, the mixed gas of the first etching gas and the second etching gas is used to etch the silicon carbide films 22 and 27. In this way, it is possible to etch the side walls of the interconnection grooves 30 anisotropically and further suppress defects that a deposit or a reactant is generated on the surface of the Cu interconnections 21 exposed to the bottom of the interconnection grooves 30.

As the etching machine used in the formation of the interconnection grooves 30, others than the dry etching machine 100 illustrated in FIG. 8 may be used. Examples thereof include various dry etching machines making it possible to decompose the mixed gas of the first etching gas and the second etching gas into plasma, such as a microwave plasma etching machine using a microwave having a frequency of 2.45 GHz oscillated from a magnetron, a TCP (transfer coupled plasma) dry etching machine using high frequency induction, and a helicon wave plasma etching machine using a helicon wave. The pressure of the mixed gas, the flow ratio between the component gases thereof, the etching temperature and so on are not limited to those described as the above-mentioned conditions, and may be appropriately changed dependently on the used machine.

Figure 15:
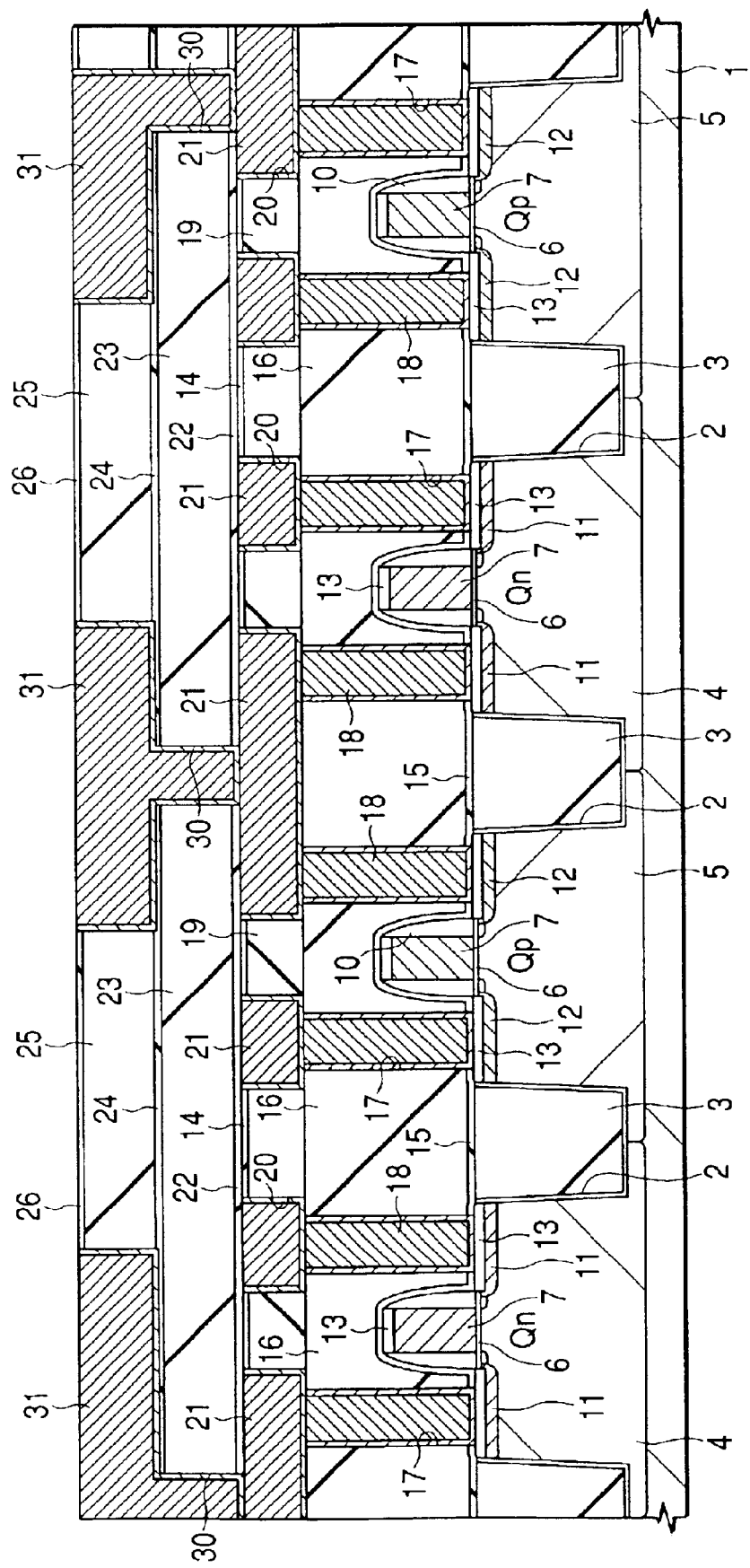
FIG. 15 is a sectional view of a principal portion of the semiconductor substrate illustrating the process of fabricating the semiconductor integrated circuit device which is the embodiment of the present invention.

Next, as illustrated in FIG. 15, the Cu interconnections 31 as the second layer are formed inside the interconnection grooves 30. The Cu interconnections 31 as the second layer may be formed according to the method of forming the Cu interconnections 21 as the first layer.

Thereafter, the above-mentioned steps are repeated, the situation of which is not illustrated, so that the Cu interconnections made of plural layers are formed over the Cu interconnections 31 as the second layer, thereby finishing a CMOS-LSI of the present embodiment.

Embodiment 2

The following will describe, as the present embodiment, a case in which a siloxane (SiO)-based, low dielectric constant (Low-k) insulating film is used as an interlayer insulating film material and silicon nitride films are used as a diffusion barrier layer and an etching stopper layer. In the present embodiment, a SiOF film having a dielectric constant of 3.5 is used as the interlayer insulating film material. However, it is allowable to use Borne other inorganic or organic siloxane-based material (organic glass type insulating film), for example, HSQ (hydrogen silsesquioxane), MSQ (methyl silsesquioxane), porous HSQ or porous MSQ.

Examples of the HSQ-based material include "OCD T-12" (made by Tokyo Ohka Kogyo Co., Ltd., dielectric constant=3.4–2.9), "FOx" (made by Dow Corning Co. in USA, dielectric constant=2.9), and "OCL T-32" (made by Tokyo Ohka Kogyo Co., Ltd., dielectric constant=2.5) Examples of the MSQ-based material include "OCD T-9" (made by Tokyo Ohka Kogyo Co., Ltd., dielectric constant=2.7), "LDK-T200" (made by JSR Co., dielectric constant=2.7–2.5), "HOSP" (made by Honeywell Electronic Materials Co., dielectric constant=2.5), "HSG-RZ25" (made by Hitachi Chemical Co., Ltd., dielectric constant=2.5), "OCL T-31" (made by Tokyo Ohka Kogyo Co., Ltd., dielectric constant=2.3), and "LKD-T400" (made by JSR Co., dielectric constant=2.2–2 and heat resistant temperature=450° C.).

Examples of the porous HSQ-based material include "XLK" (made by Dow Corning Co., dielectric constant= 2.5–2), "OCL T-72" (made by Tokyo Ohka Kogyo Co., Ltd., dielectric constant=2.2–1.9), "Nanoglass" (made by Honeywell Electronic Materials Co., dielectric constant=2.2–1.8), and "MesoELK" (made by Air Products and Chemicals Co., dielectric constant=2 or less). Examples of the porous MSQ-based material include "HSG-6211X" (made by Hitachi Chemical Co., Ltd., dielectric constant=2.4), "ALCAP-S" (made by Asahi Chemical Industry Co., Ltd., dielectric constant=2.3–1.8), "OCLT-77" (made by Tokyo Ohka Kogyo Co., Ltd., dielectric constant=2.2–1.9), "HSG-6210X" (made by Hitachi Chemical Co., Ltd., dielectric constant=2.1), and "silica aerogel" (made by Kobe Steel, Ltd, dielectric constant=1.4–1.1).

Figure 16:
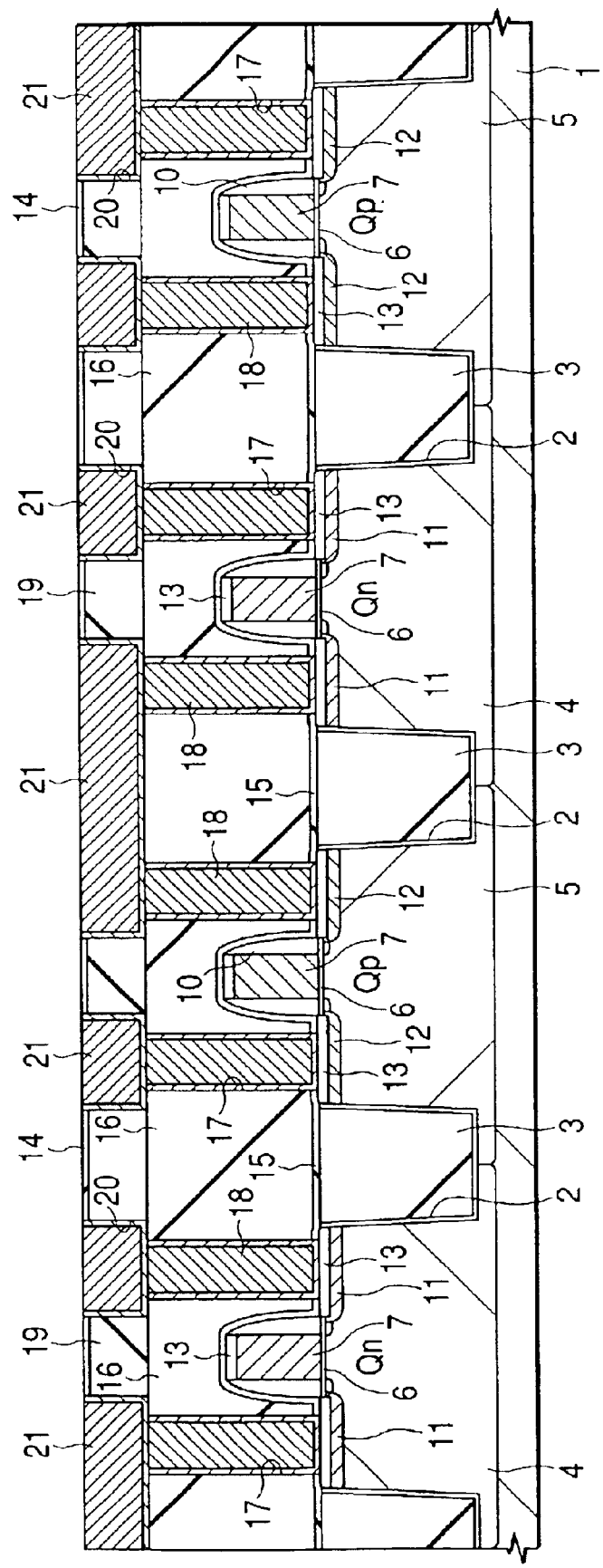
FIG. 16 is a sectional view of a principal portion of a semiconductor substrate illustrating a process of fabricating a semiconductor integrated circuit device which is another embodiment of the present invention.

As illustrated in FIG. 16, Cu interconnections 21 as a first layer are first formed over n-channel type MISFETs Qn and p-channel type MISFETs Qp. A process up to this step is the same as illustrated in FIGS. 1 to 6 about Embodiment 1.

Figure 17:
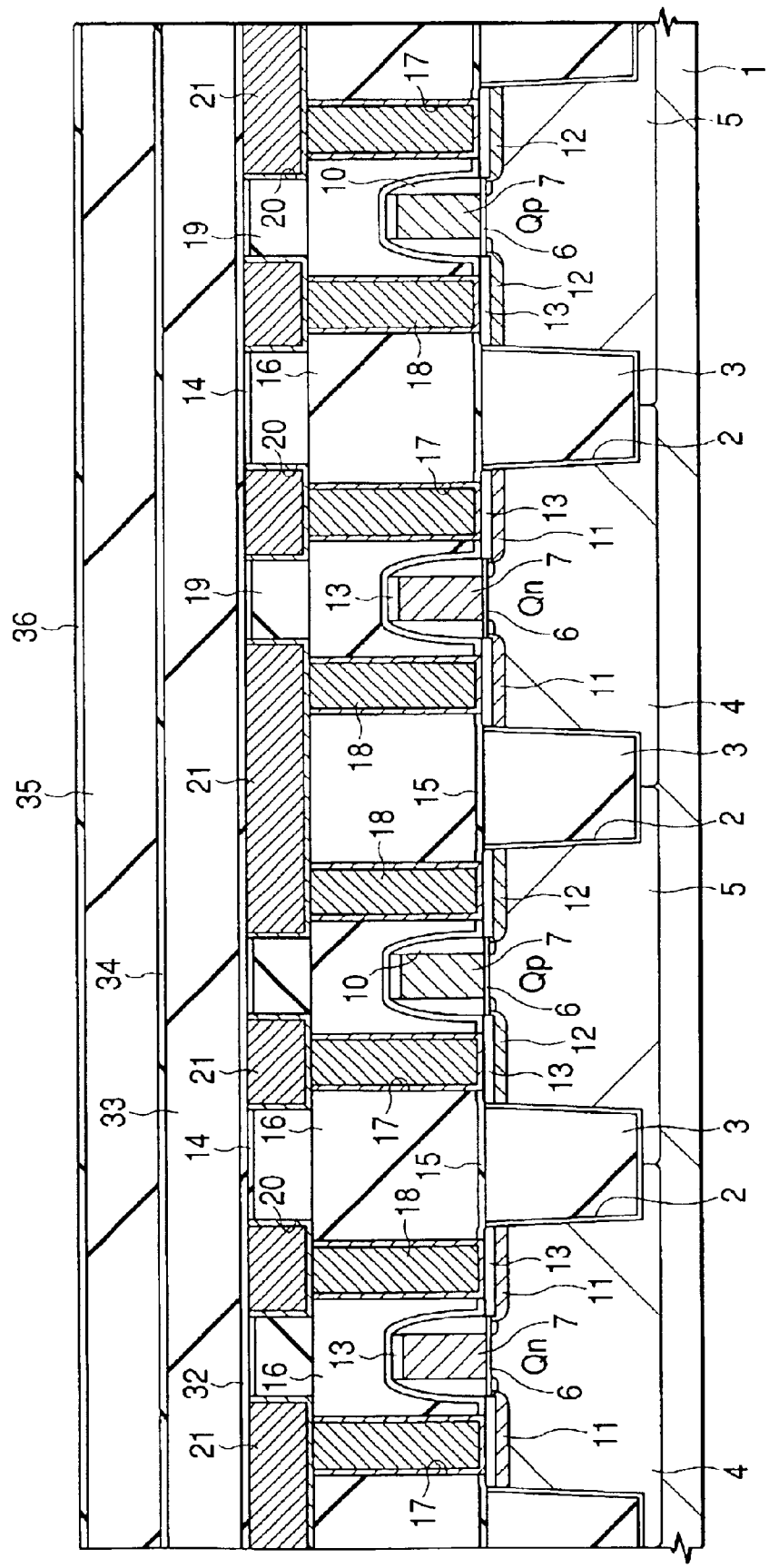
FIG. 17 is a sectional view of a principal portion of the semiconductor substrate illustrating the process of fabricating the semiconductor integrated circuit device which is another embodiment of the present invention.

Next, as illustrated in FIG. 17, a silicon nitride film 32, a SiOF film 33, a silicon nitride film 34, a SiOF film 35, and a silicon nitride film 36 are successively deposited on the Cu interconnections 21 by CVD.

Next, the silicon nitride film 36, the SiOF film 35, the silicon nitride film 34, the SiOF film 33 and the silicon nitride film 32 are successively dry-etched to make interconnection grooves. In the same way as in Embodiment 1, conditions required when the silicon nitride film 32 covering the Cu interconnections 21 is dry-etched are as follows:
  (a) the side walls of the interconnection grooves can be anisotropically etched, that is, the side walls of the interconnection grooves are perpendicularly etched, and (b) a deposit or a reactant is not easily generated on the surface of the Cu interconnections exposed to the bottom of the interconnection grooves.

About a large number of gas species, the inventors calculated adsorption characters of ions or radicals generated by decomposition thereof by molecular orbital calculation based on a density functional theory. As a result, it was concluded that optimal for an etching gas satisfying the conditions (a) and (b) is a mixed gas of $SF_6$, HBr and $N_2$ (or $NH_3$ instead of $N_2$).

It can be presumed that according to the mixed gas, one part of halogen ions or halogen radicals generated by decomposition thereof is bonded to silicon in the silicon nitride molecules to generate a deposit on the side walls of the interconnection grooves, and further this deposit is etched by the other part so that ions or radicals generated by decomposition of $N_2$ (or $NH_3$) are bonded to nitrogen in the silicon nitride molecules to generate nitrogen gas. This mixed gas does not contain any oxygen; therefore, it is not feared that an oxide is formed on the surface of the Cu interconnections. Furthermore, the mixed gas does not contain any hydrofluorocarbon gas or fluorocarbon gas which can generate a fluorocarbon polymer, such as $CF_4$, $CHF_3$, or $C_4F_8$; therefore, it is not feared that a deposit is excessively formed on the side walls of the interconnection grooves and the surface of the Cu interconnections. Any one of $N_2$ and $NH_3$ may be used. However, $N_2$ has an advantage that it does not have any toxicity at all; therefore, the mixed gas of $SF_6$, HBr and $N_2$ is easier to handle than the mixed gas of $SF_6$, HBr and $NH_3$.

A machine for the dry etching which can be used may be any one of various dry etching machines making it possible to decompose the above-mentioned mixed gas into plasma, such as a machine as illustrated in FIG. 8, a microwave plasma etching machine, a TCP dry etching machine, and a helicon wave plasma etching machine.

Figure 18:
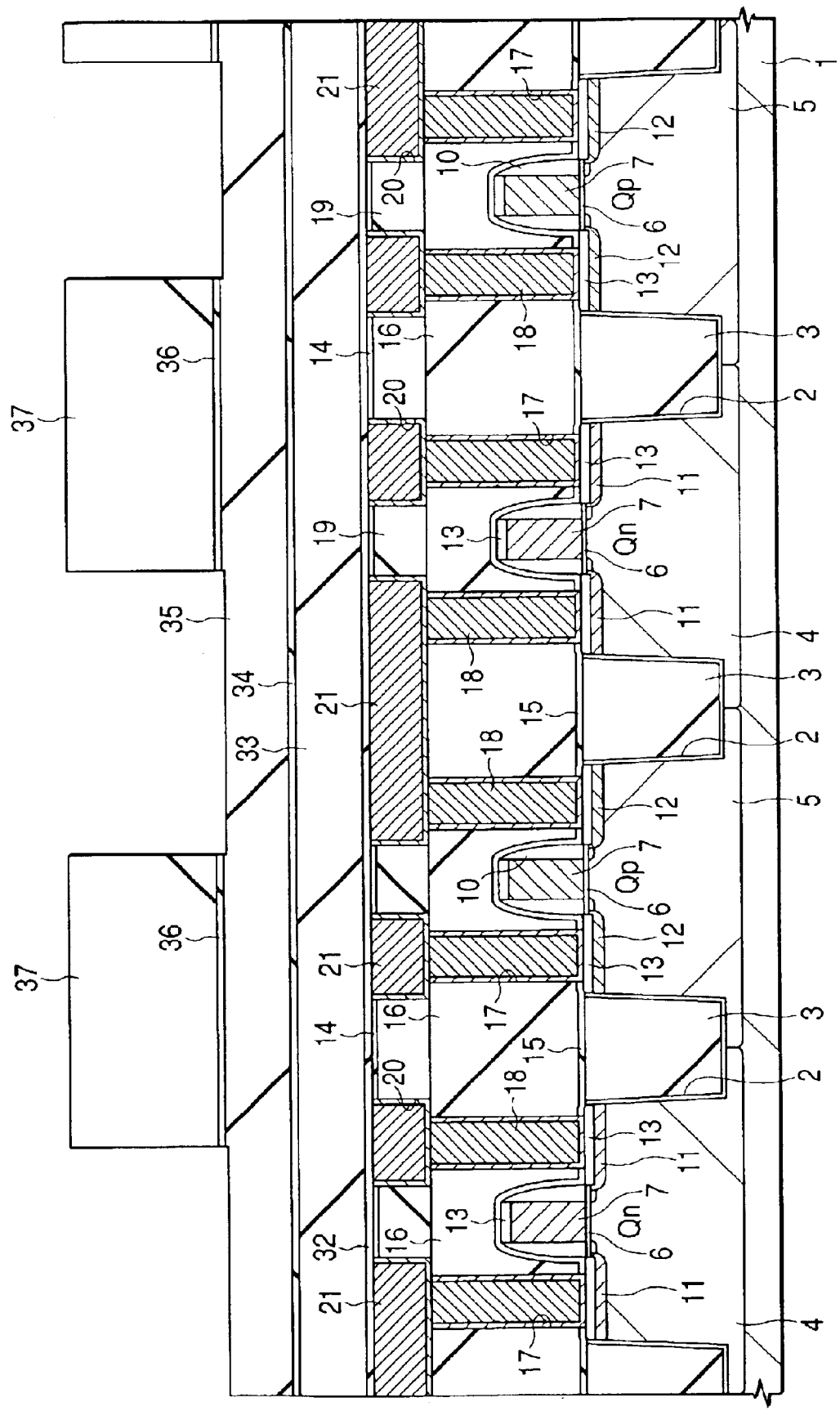
FIG. 18 is a sectional view of a principal portion of the semiconductor substrate illustrating the process of fabricating the semiconductor integrated circuit device which is another embodiment of the present invention.

In order to use, for example, the dry etching machine illustrated in FIG. 8 to make the interconnection grooves, as illustrated in FIG. 18, the silicon nitride film 36 in the interconnection groove forming areas is first removed by dry etching using a photoresist 37 as a mask. At this time, the mixed gas of $SF_6$, HBr and $N_2$ is used as an etching gas to etch the silicon nitride film 36 anisotropically and further stop the etching by the underlying SiOF film 35.

Figure 19:
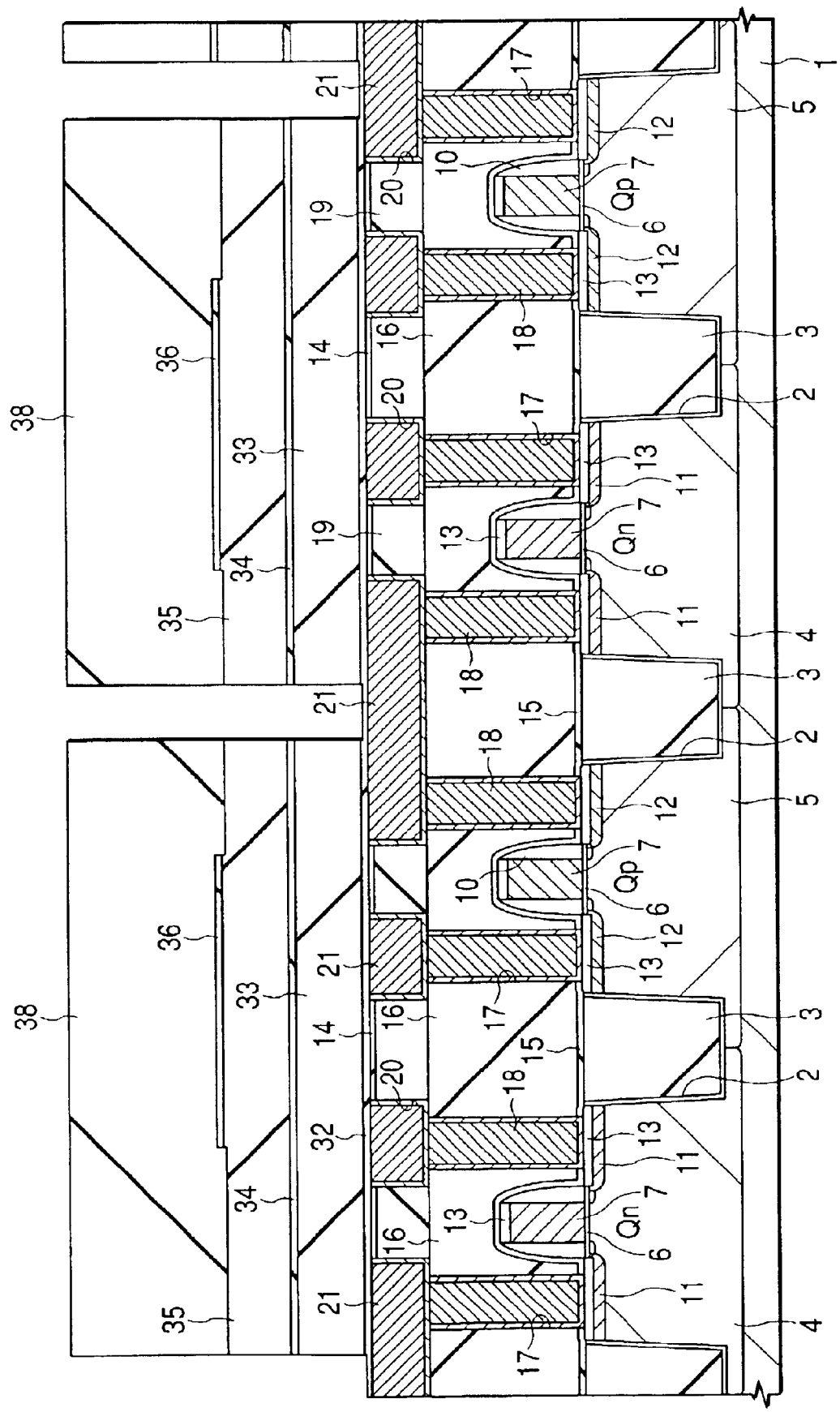
FIG. 19 is a sectional view of a principal portion of the semiconductor substrate illustrating the process of fabricating the semiconductor integrated circuit device which is another embodiment of the present invention.

Next, the photoresist film 37 is removed. Thereafter, as illustrated in FIG. 19, the SiOF film 35, the silicon nitride film 34, and the SiOF film 33 in some portions of the interconnection groove forming areas are successively removed by dry etching using a photoresist film 38. At this time, the mixed gas of $C_4F_8$, Ar and oxygen is used as an etching gas for the SiOF films 35 and 33 to etch the SiOF films 35 and 33 anisotropically and further stop the etching by the underlying silicon nitride films 34 and 32. The mixed gas of $SF_6$, HBr and $N_2$ is used as an etching gas for the silicon nitride film 34 to etch the silicon nitride film 34 anisotropically and further stop the etching by the underlying SiOF film 33.

Figure 20:
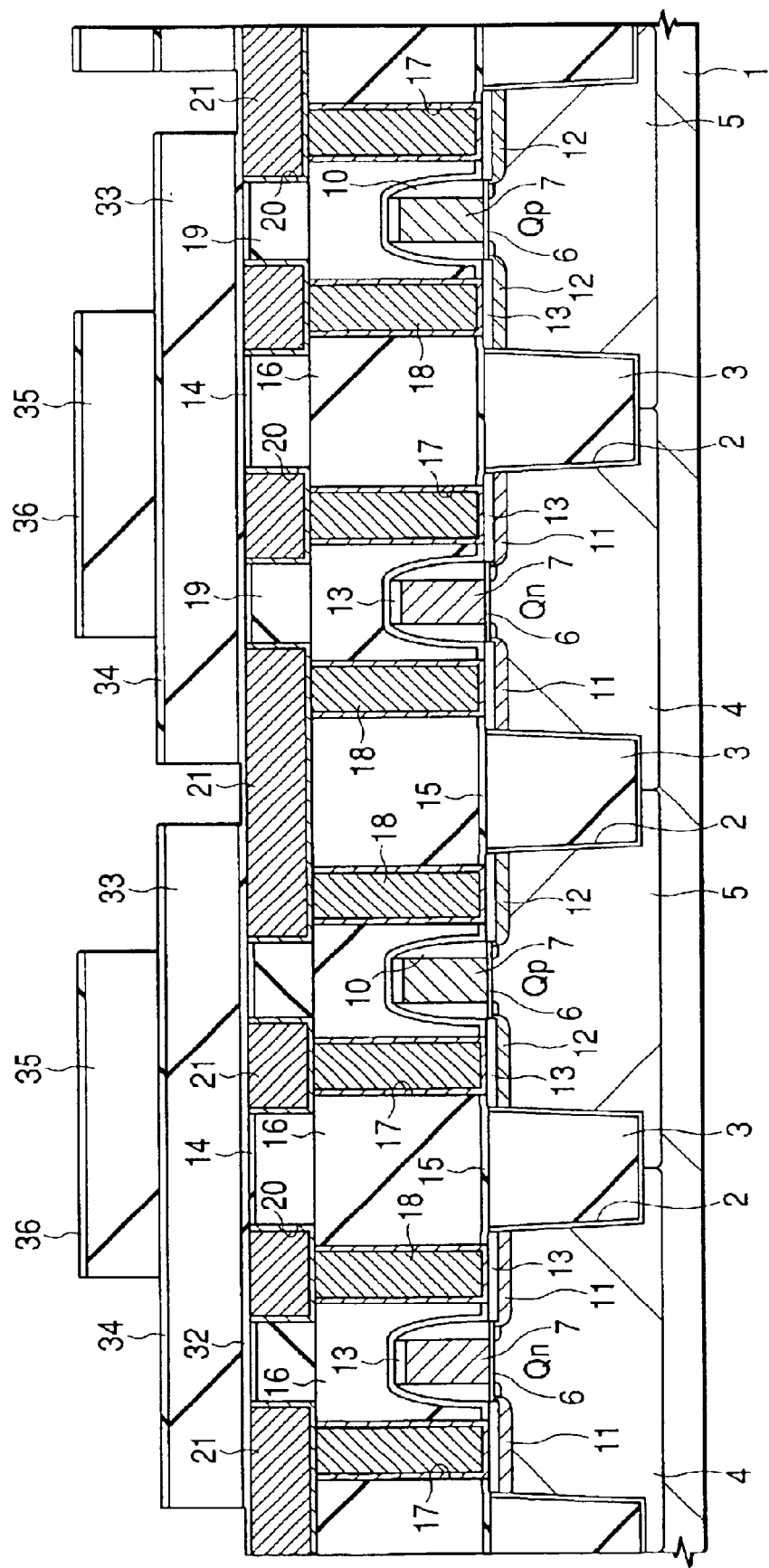
FIG. 20 is a sectional view of a principal portion of the semiconductor substrate illustrating the process of fabricating the semiconductor integrated circuit device which is another embodiment of the present invention.

Next, the photoresist film 38 is removed. Thereafter, as illustrated in FIG. 20, the SiOF film 35 is removed by dry etching using the silicon nitride films 36 and 34 as masks. The etching gas for the SiOF film 35 is the mixed gas of $C_4F_8$, Ar and oxygen.

Figure 21:
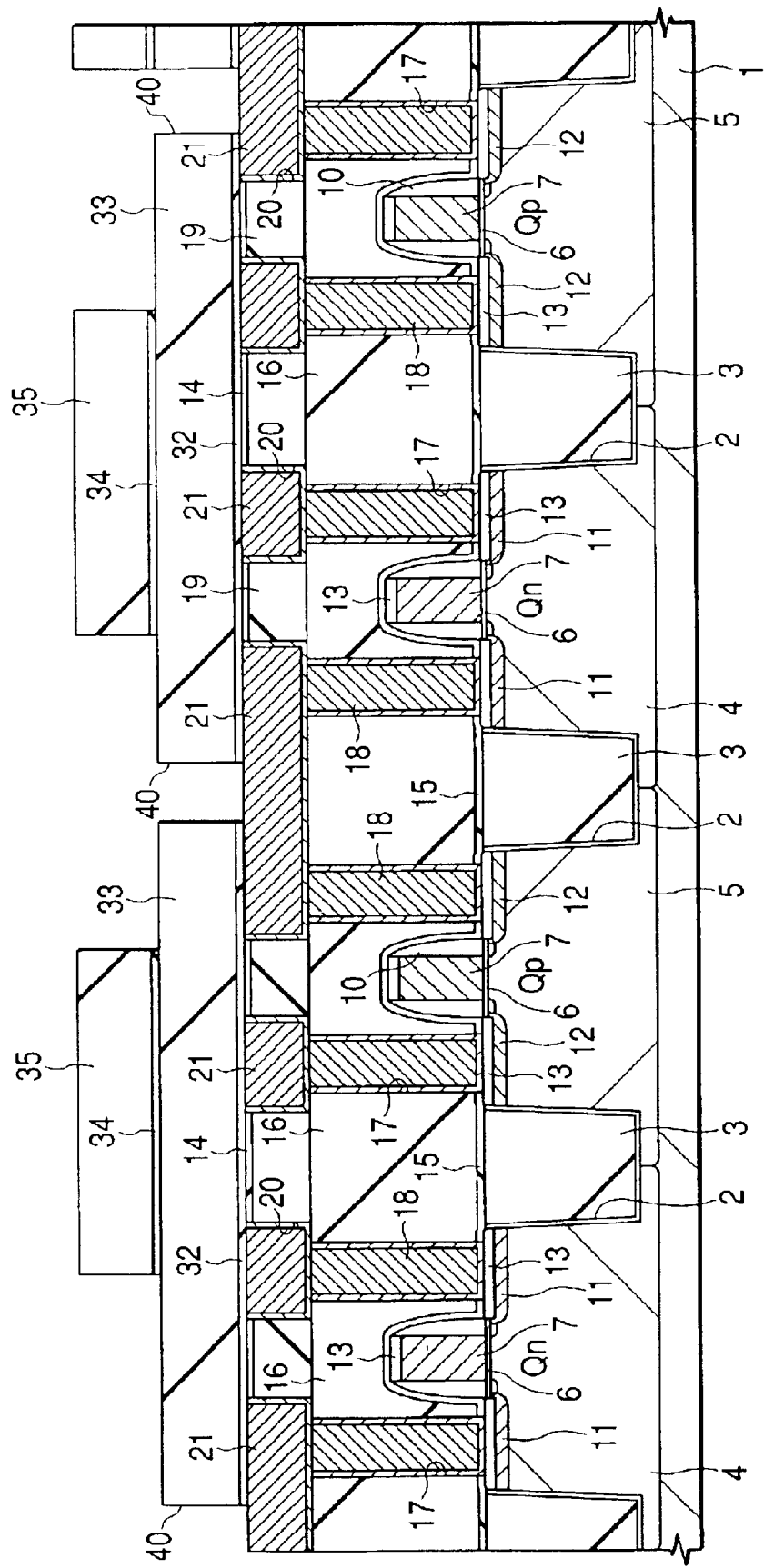
FIG. 21 is a sectional view of a principal portion of the semiconductor substrate illustrating the process of fabricating the semiconductor integrated circuit device which is another embodiment of the present invention.

Next, as illustrated in FIG. 21, the silicon nitride film 36 covering the SiOF film 35, the silicon nitride film 34 covering the SiOF film 33, and the silicon nitride film 32 covering the Cu interconnections 21 are dry-etched to form interconnection grooves 40 over the Cu interconnections 21.

At this time, the etching gas used in the dry etching of the silicon nitride films 36, 34 and 32 is the above-mentioned mixed gas of $SF_6$, HBr and $N_2$. An example of etching conditions is as follows: gas pressure=4 Pa, flow ratio of $SF_6/HBr/N_2$=25/15/10 (ml/minute), high frequency power applied to the counter electrode 102=600 W, high frequency power applied to the stage 106=200 W, and stage temperature=30° C.

The above-mentioned mixed gas is used to dry-etch the silicon nitride films 36, 34 and 32, thereby working the side walls of the interconnection grooves 40 perpendicularly and further suppressing defects that a deposit and a reactant adhere to the surface of the Cu interconnections 21 exposed to the bottom of the interconnection grooves 40. The pressure of the mixed gas, the flow ratio between the component gases thereof, the etching temperature and so on are not limited to those described as the above-mentioned conditions, and may be appropriately changed dependently on the used machine.

Figure 22:
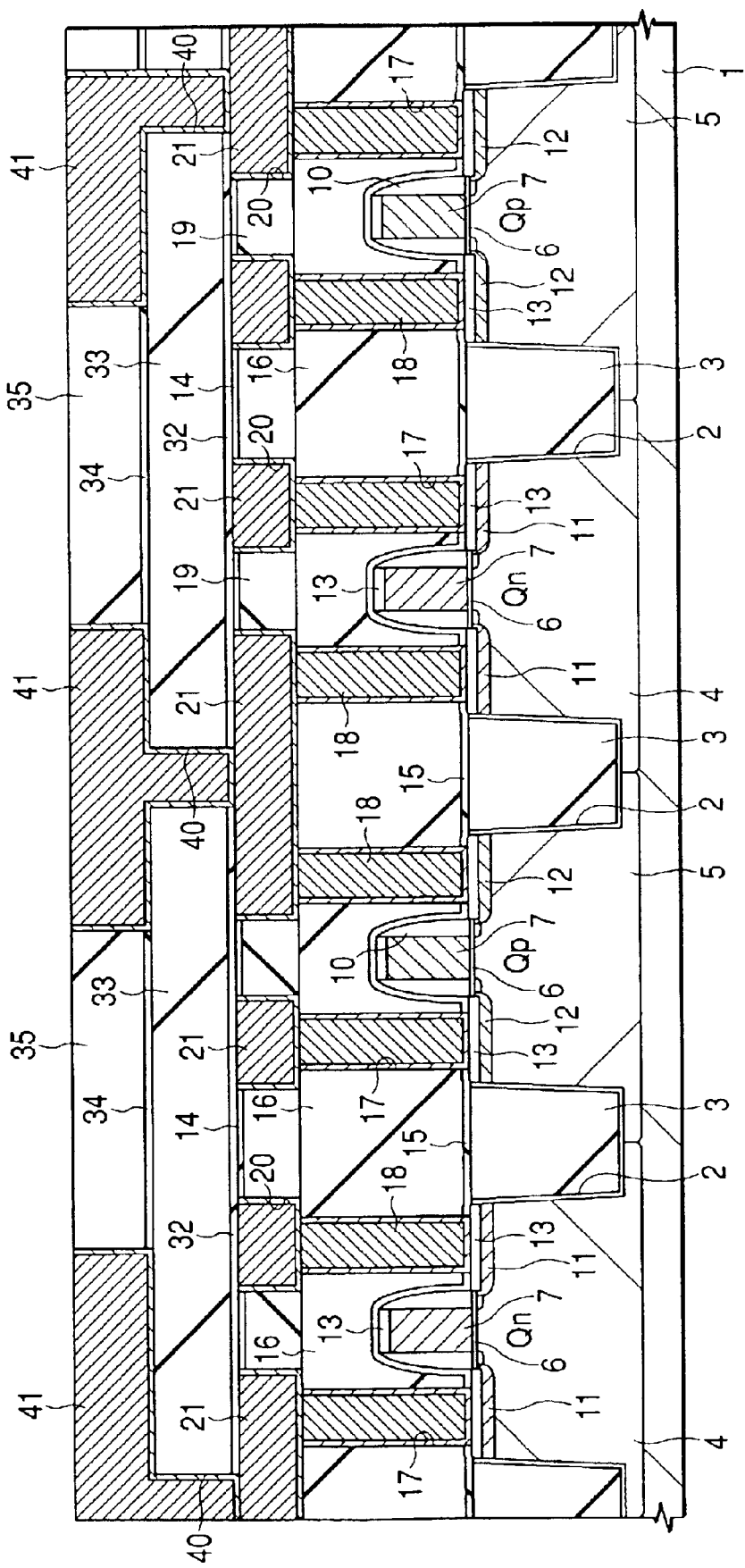
FIG. 22 is a sectional view of a principal portion of the semiconductor substrate illustrating the process of fabricating the semiconductor integrated circuit device which is another embodiment of the present invention.

Next, as illustrated in FIG. 22, Cu interconnections 41 as a second layer are formed inside the interconnection grooves 40. The Cu interconnections 41 as the second layer may be formed according to the method of forming the Cu interconnections 21 as the first layer. Thereafter, the above-mentioned steps are repeated, a situation of which is not illustrated, so as to form Cu interconnections, which are composed of plural layers, over the Cu interconnections 41 as the second layer.

Embodiment 3

A process of fabricating a CMOS-LSI according to the present embodiment will be described in order of the steps thereof, referring to FIGS. 23 to 33.

Figure 23:
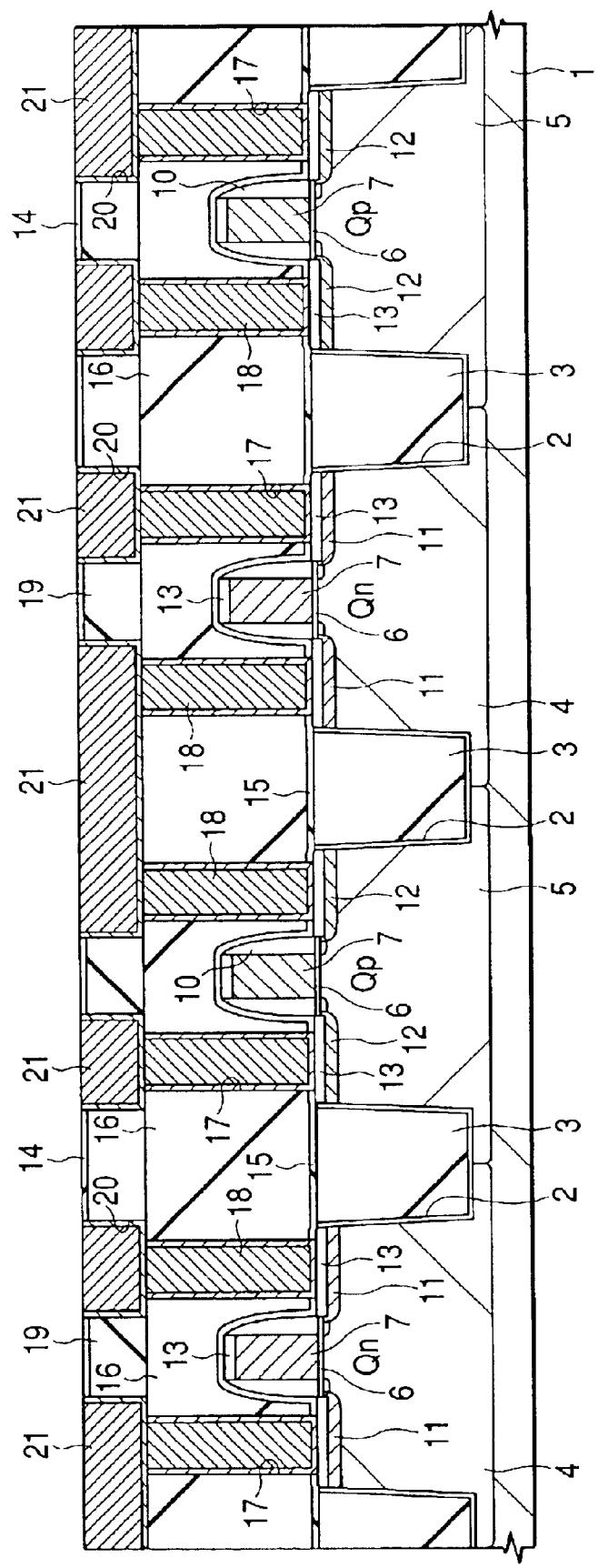
FIG. 23 is a sectional view of a principal portion of a semiconductor substrate illustrating a process of fabricating a semiconductor integrated circuit device which is further another embodiment of the present invention.

As illustrated in FIG. 23, n-channel type MISFETs Qn and p-channel type MISFETs Qp are formed over a substrate 1. Thereafter, Cu interconnections 21 as a first layer are formed thereon. A process up to this step is the same as illustrated in FIGS. 1 to 6 about Embodiment 1.

Figure 24:
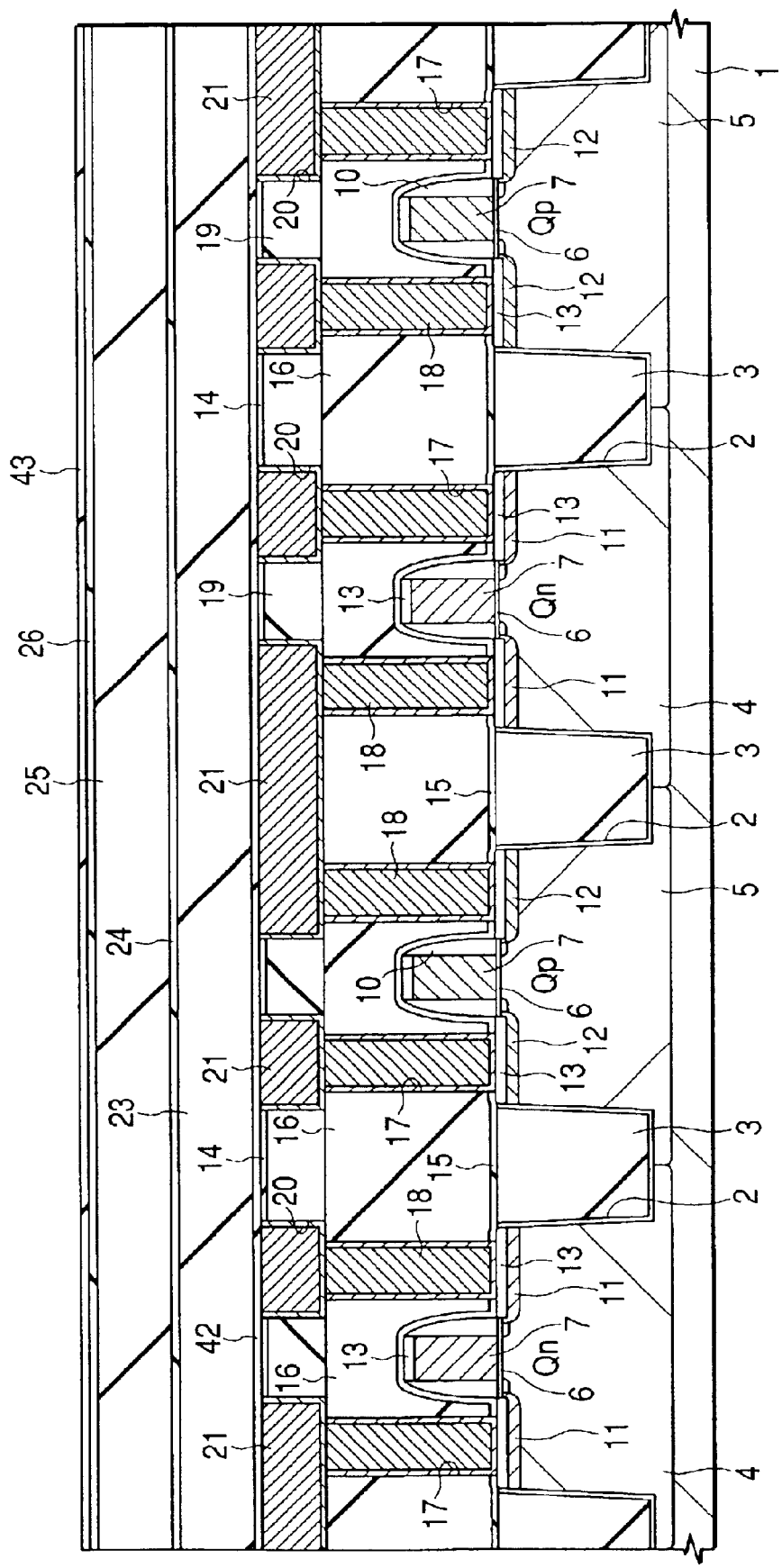
FIG. 24 is a sectional view of a principal portion of the semiconductor substrate illustrating the process of fabricating the semiconductor integrated circuit device which is further another embodiment of the present invention.

Next, as illustrated in FIG. 24, a silicon carbonitride (SiCN) film 42, an organic insulating film 23, a silicon oxide film 24, an organic insulating film 25, a silicon oxide film 26 and a silicon carbonitride film 43 are successively deposited over the Cu interconnections 21. The silicon oxide films 24 and 26 are deposited by CVD. The organic insulating films 23 and 25 are formed by depositing an insulating material having a smaller dielectric constant than silicon oxide, for example, the above-mentioned "SiLK" or "FLARE", by spin coating. The silicon carbonitride films 22 and 27 are formed by depositing, for example, "BLOk" (made by Applied Materials in USA, dielectric constant: 4.3) by plasma CVD using a mixed gas of trimethylsilane and ammonia as a source gas.

The silicon carbonitride film 42 lying between the Cu interconnections 21 and the organic insulating film 23 functions as a diffusion barrier layer for preventing Cu in the Cu interconnections 21 from diffusing into the organic insulating film 23 in the same way as the above-mentioned silicon carbide film 22. The silicon carbonitride film 43 as the topmost layer functions as a hard mask for preventing, when the silicon oxide film 24 is etched, the overlying silicon oxide film 26 in same way as the above-mentioned silicon carbide film 27.

Next, the lamination film made of the silicon carbonitride film 43, the silicon oxide film 26, the organic insulating film 25, the silicon oxide film 24, the organic insulating film 23 and the silicon carbonitride film 42 is dry-etched to form interconnection grooves. The manner of dry-etching this lamination film may be the same as illustrated in FIGS. 9 to 14 about Embodiment 1 except that the gas used when the silicon carbonitride film 42 as the lowermost layer is etched is changed.

Figure 25:
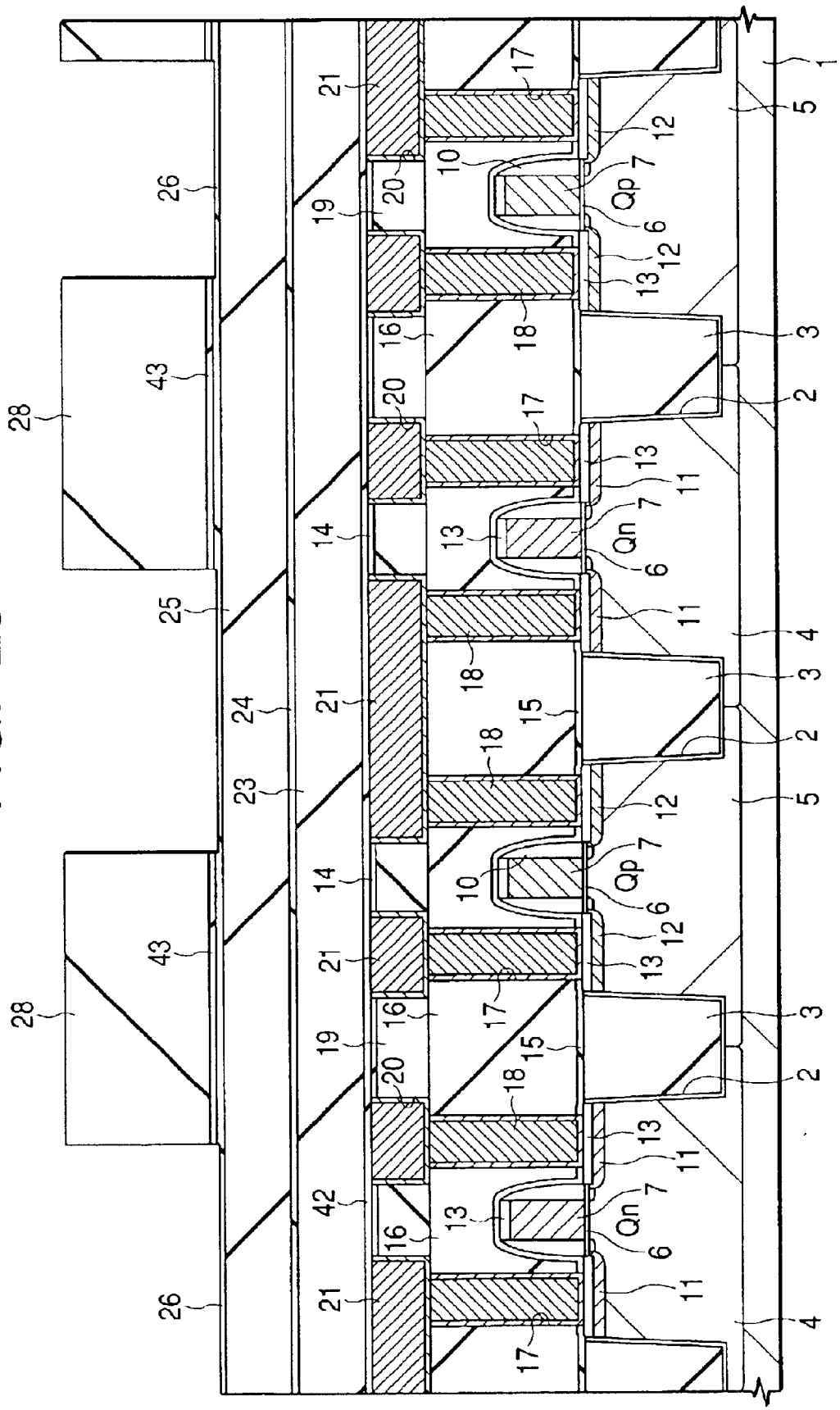
FIG. 25 is a sectional view of a principal portion of the semiconductor substrate illustrating the process of fabricating the semiconductor integrated circuit device which is further another embodiment of the present invention.

That is, the substrate 1 on which the lamination film is deposited is carried into the treating chamber 104 of the etching machine 200 illustrated in FIG. 8, and the silicon carbonitride film 43 in interconnection groove forming areas is first removed by dry etching using the photoresist film 28 as a mask, as illustrated in FIG. 25. The etching gas used at this time is the above-mentioned mixed gas of a first etching gas comprising at least one selected from $SF_6$, HCl, HBr, $Cl_2$, $ClF_3$, and $CF_4$, and a second etching gas comprising at least one selected from $NH_3$, $N_2H_4$, and a mixed gas of $N_2$ and $H_2$, particularly the mixed gas of $SF_6$ and $NH_3$. Conditions for etching the silicon carbonitride film 43 using this mixed gas are the same as for etching the silicon carbide film.

Figure 26:
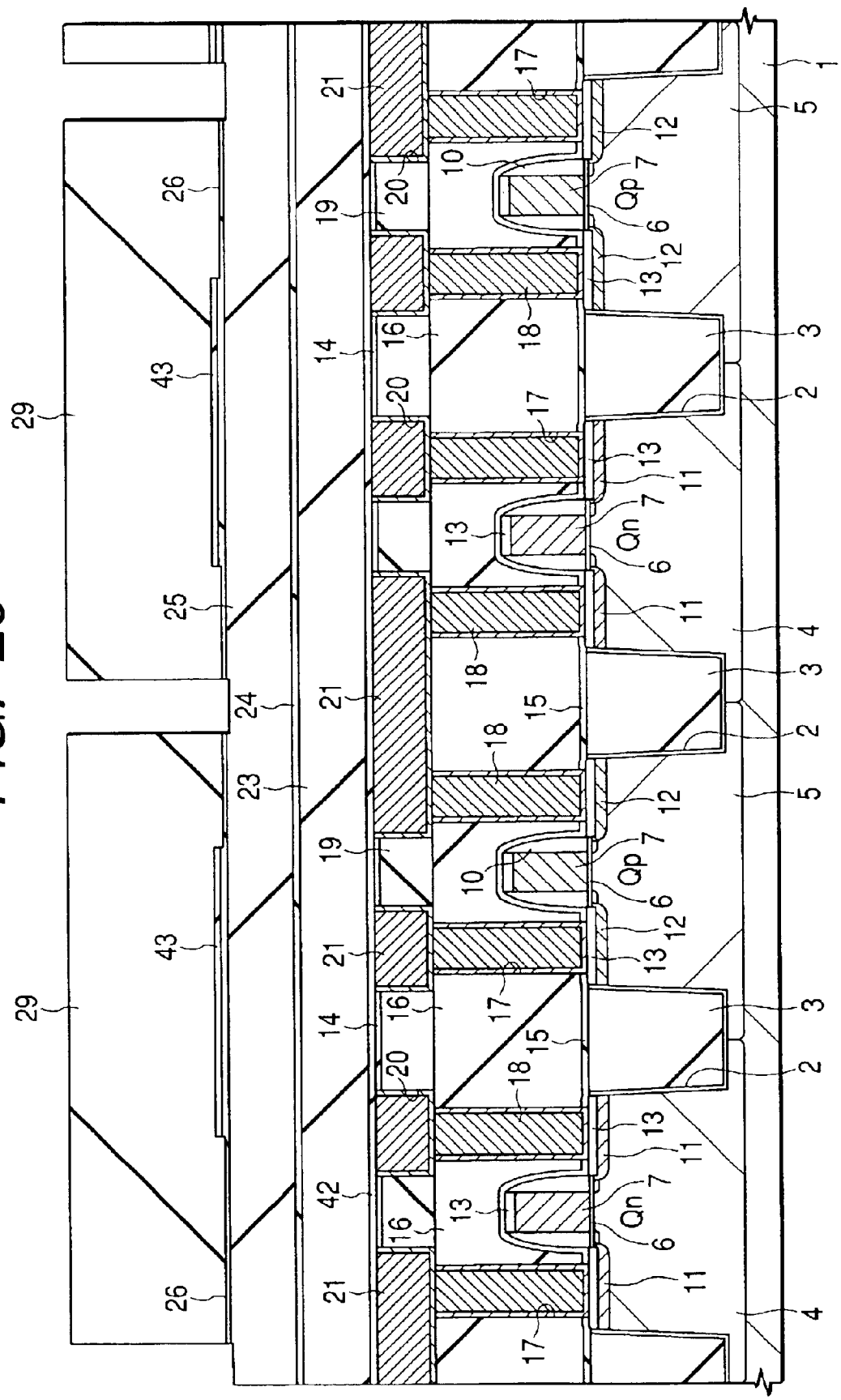
FIG. 26 is a sectional view of a principal portion of the semiconductor substrate illustrating the process of fabricating the semiconductor integrated circuit device which is further another embodiment of the present invention.

Next, the photoresist film 28 is removed, and subsequently the silicon oxide film 26 in some parts of the interconnection groove forming areas is removed by dry etching using the photoresist film 29 as a mask, as illustrated in FIG. 26. The etching gas used at this time is a mixed gas of $C_4F_8$, Ar and oxygen.

Figure 27:
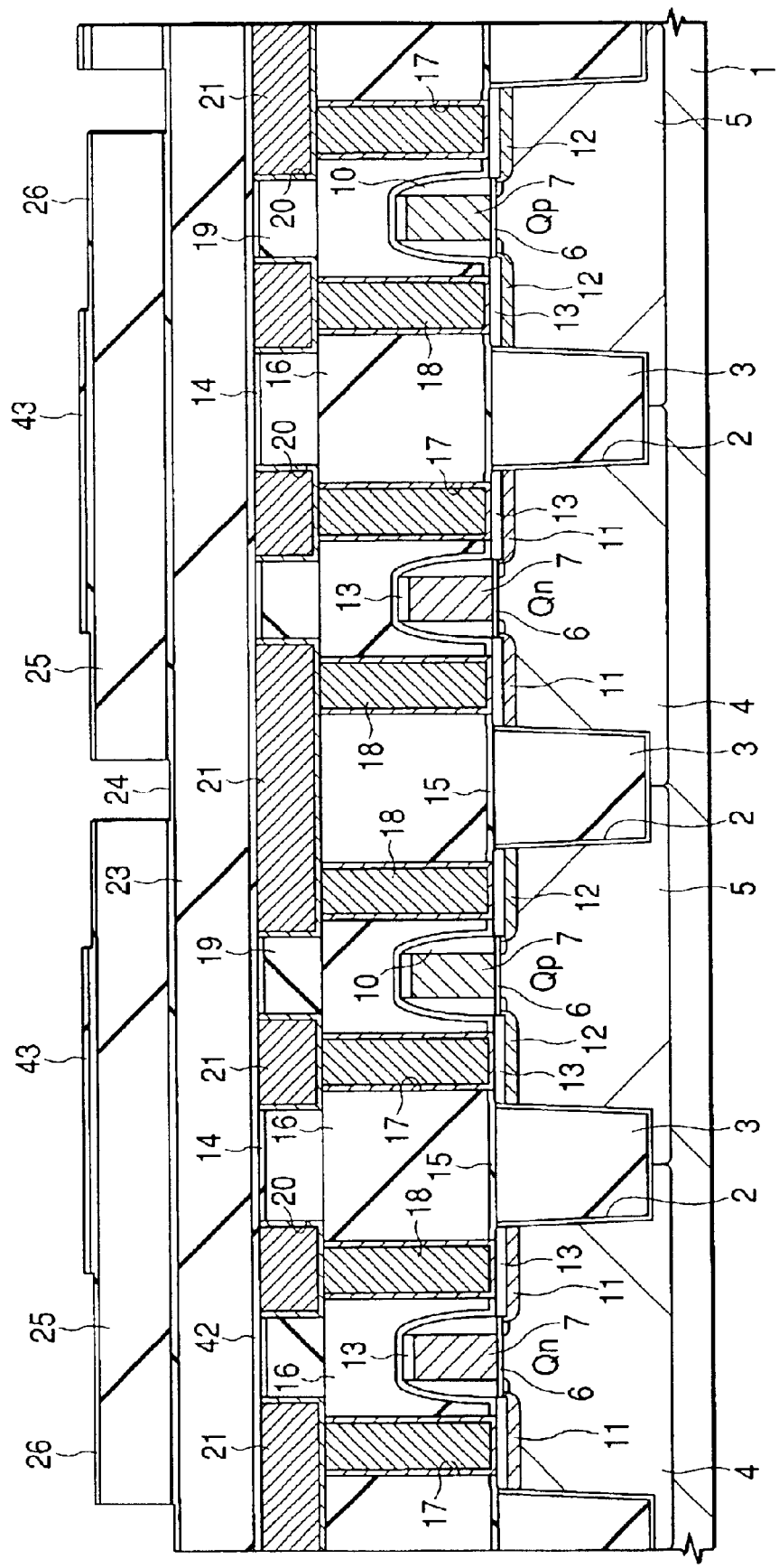
FIG. 27 is a sectional view of a principal portion of the semiconductor substrate illustrating the process of fabricating the semiconductor integrated circuit device which is further another embodiment of the present invention.

Next, as illustrated in FIG. 27, the organic insulating film 25 exposed by the above-mentioned etching and the photoresist film 29 are simultaneously dry-etched. The etching gas used at this time is a gas containing nitrogen and hydrogen, for example, $NH_3$, $N_2H_4$ or a mixed gas of $N_2$ and $H_2$.

Figure 28:
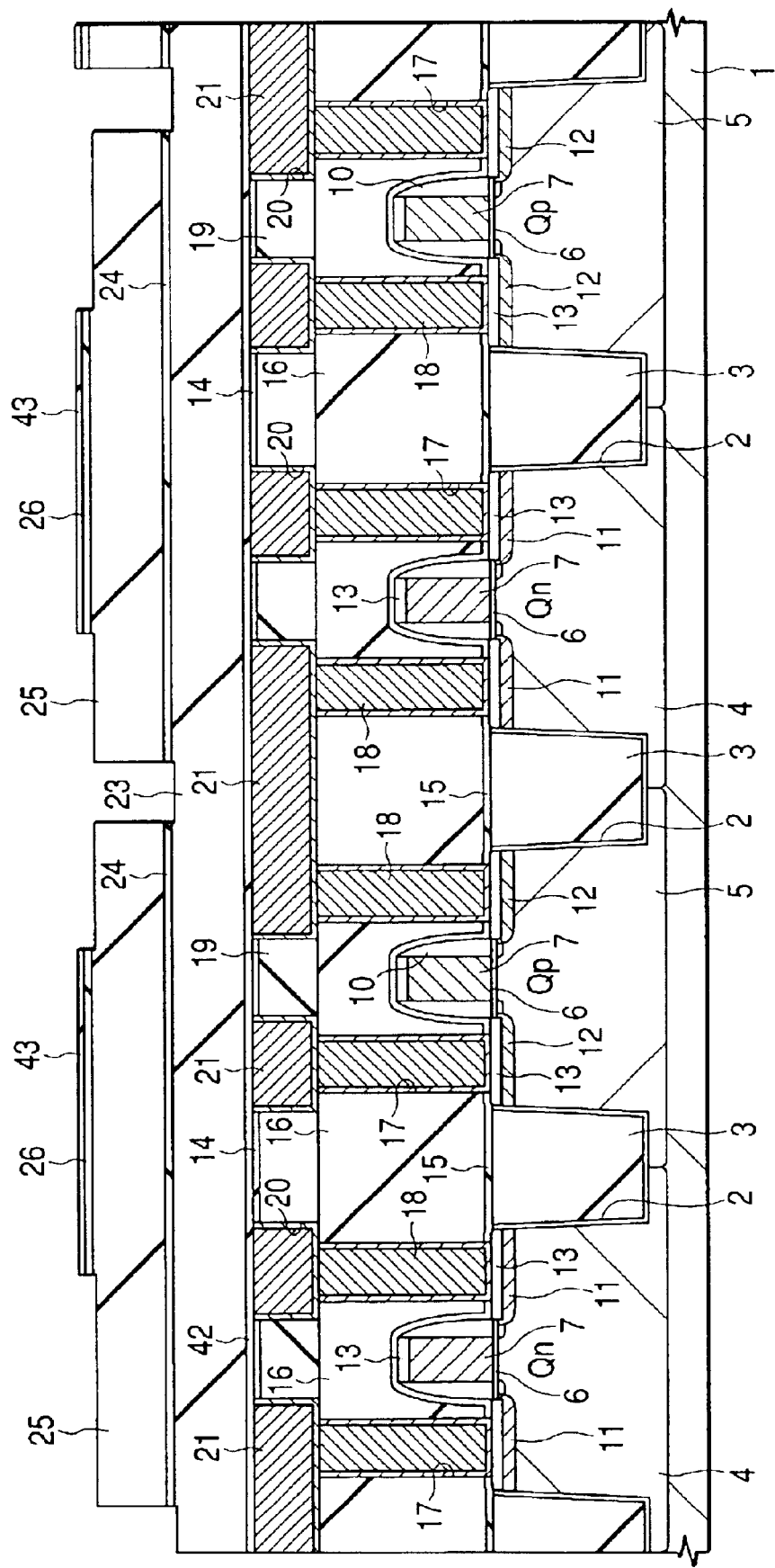
FIG. 28 is a sectional view of a principal portion of the semiconductor substrate illustrating the process of fabricating the semiconductor integrated circuit device which is further another embodiment of the present invention.

Next, as illustrated in FIG. 28, the silicon oxide films 24 and 26 exposed by the above-mentioned etching are dry-etched. The etching gas used at this time is a mixed gas of $C_4F_8$, Ar and oxygen.

Figure 29:
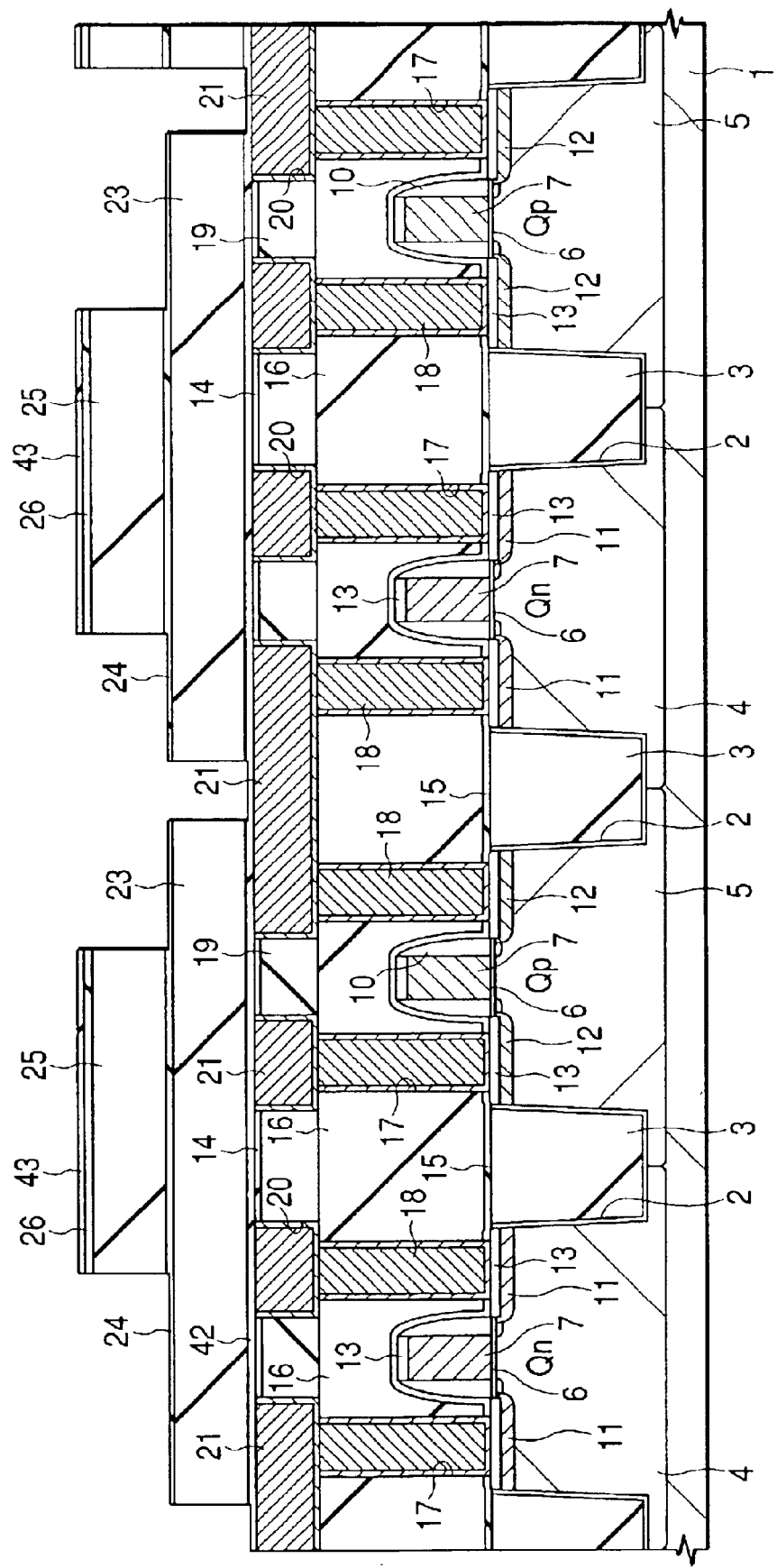
FIG. 29 is a sectional view of a principal portion of the semiconductor substrate illustrating the process of fabricating the semiconductor integrated circuit device which is further another embodiment of the present invention.

Next, as illustrated in FIG. 29, the organic insulating films 25 and 23 exposed by the above-mentioned etching are dry-etched. At this time, a gas containing nitrogen and hydrogen, for example, $NH_3$, $N_2H_4$ or a mixed gas of $N_2$ and $H_2$ is used as an etching gas to etch the organic insulating films 25 and 23 anisotropically and further stop the etching by the surface of the silicon oxide film 24 underlying the organic insulating film 25 and the surface of the silicon carbonitride film 42 underlying the organic insulating film 23.

Figure 30:
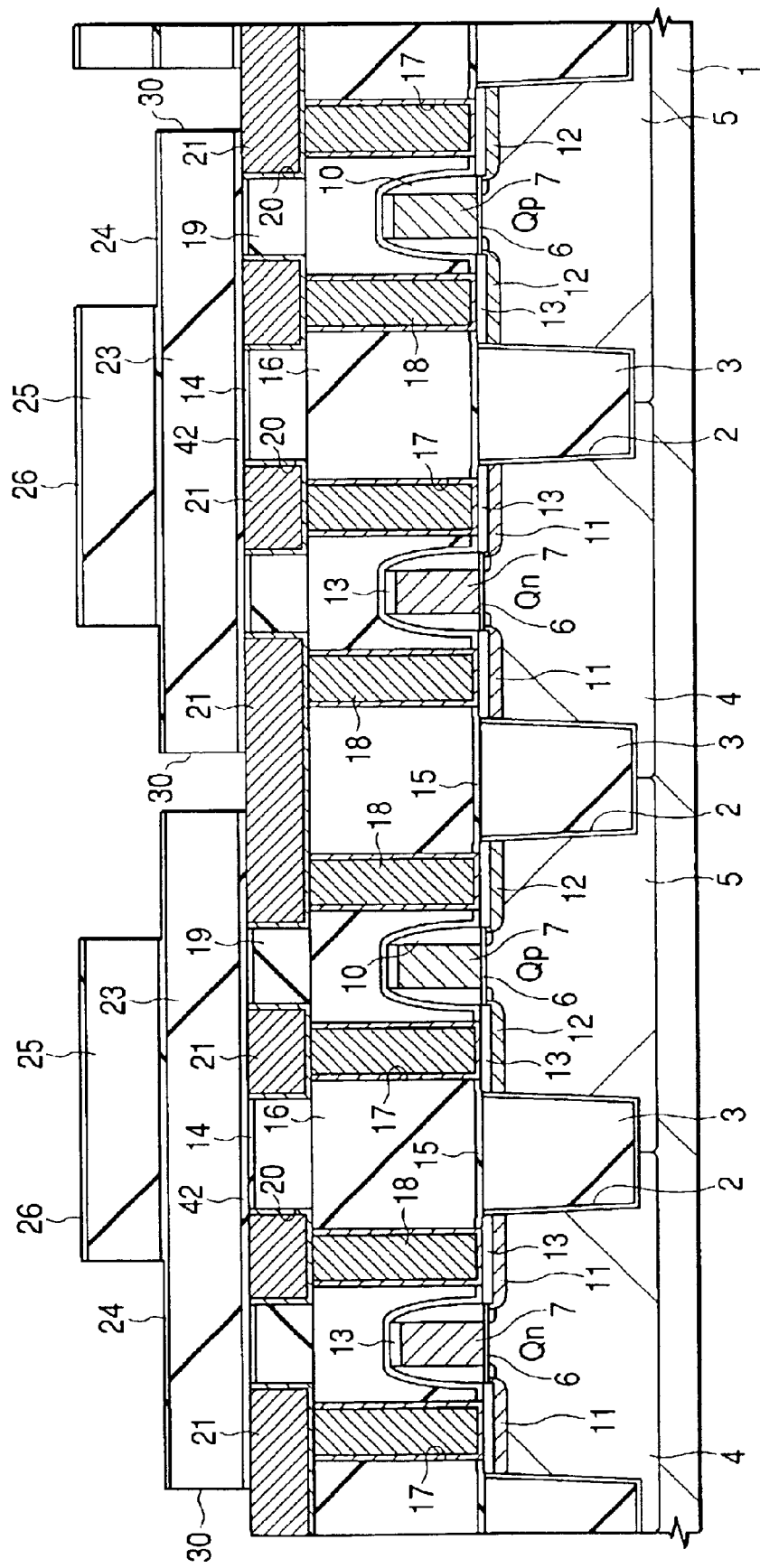
FIG. 30 is a sectional view of a principal portion of the semiconductor substrate illustrating the process of fabricating the semiconductor integrated circuit device which is further another embodiment of the present invention.

Next, as illustrated in FIG. 30, the silicon carbonitride film 42 exposed by the above-mentioned etching is dry-etched to make some parts of the Cu interconnections 21 exposed. In this way, interconnection grooves 30 are formed over the Cu interconnections 21. At the same time, the silicon carbonitride film 43 as the topmost layer is dry-etched to make the underlying silicon oxide film 26 exposed.

The gas used for etching the silicon carbonitride films 42 and 43 at this time may be the above-mentioned mixed gas of $SF_6$ and $NH_3$ used for etching the silicon carbide film in Embodiment 1, but is a mixed gas of $CHF_3$ and $N_2$ in the present embodiment.

As described in Embodiment 1, in the case in which a mixed gas of Ar and a hydrofluorocarbon gas such as $CHF_3$ is used to dry-etch the silicon carbide film, a large amount of a deposit made mainly of a fluorocarbon organic substance adheres to the surface of the Cu interconnections 21 and the side walls of the interconnection grooves. Accordingly, it is presumed that in the case in which a mixed gas of $CHF_3$ and Ar is used for etching the silicon carbonitride films 42 and 43, which have a chemical composition similar to that of the silicon carbide film, is used, a large amount of a deposit made mainly of a fluorocarbon organic substance adheres to the surface of the Cu interconnections 21 and the side walls of the interconnection grooves.

However, according to experiments made by the inventors, the mixed gas of $CHF_3$ and $N_2$, a mixed gas wherein Ar was further added to the mixed gas of $CHF_3$ and $N_2$ were used, respectively, to dry-etch the silicon carbonitride films 42 and 43 so that the following facts were found out: the side walls of the interconnection grooves can be anisotropically etched, that is, the side walls of the interconnection grooves can be perpendicularly etched; and a deposit or a reactant is hardly generated on the surface of the interconnections 21 exposed to the bottom of the interconnection grooves. In the case in which these mixed gases were used to dry-etch the silicon carbide film, it was also found out that a deposit or a reactant was hardly generated on the surface of the interconnections 21. Since these mixed gases do not contain oxygen, it did not happen that the surface of the Cu interconnections 21 was oxidized.

A mixed gas of $CH_2F_2$ and $N_2$, and a mixed gas of $CH_4$ and $N_2$ were used, respectively, instead of the mixed gas of $CHF_3$ and $N_2$ to dry-etch the silicon carbonitride film and the silicon carbide film. As a result, in the case in which the mixed gas of $CH_2F_2$ and $N_2$ was used, etching was stopped on the way. This can be considered to be based on the following reason: when a hydrofluorocarbon gas having a high composition ratio of hydrogen (H) is used, a large amount of a deposit is generated on the surface of the Cu interconnections 21. On the other hand, in the case in which the mixed gas of $CF_4$ and $N_2$, which does not contain any hydrogen in the molecule thereof, was used, etching advanced speedily so that the amount of a deposit on the surface of the Cu interconnections 21 was smaller than that in the case in which the mixed gas of $CHF_3$ and $N_2$ was used. However, in the case in which this mixed gas was used, the side walls of the interconnection grooves were somewhat side-etched since the deposit adhering to the side walls was reduced.

Therefore, the etching gas containing a hydrofluorocarbon gas (or a fluorocarbon gas), among etching gases which can be used when the silicon carbide film or silicon carbonitride film covering the Cu interconnections 21 is dry-etched to make the surface of the Cu interconnections 21 exposed, may be the mixed gas of $CHF_3$ and $N_2$, or the mixed gas of $CF_4$ and $N_2$. The mixed gas of $CHF_3$ and $N_2$ is particularly good from the viewpoint of easiness in use. By adding an appropriate amount of $CF_4$ to the mixed gas of $CHF_3$ and $N_2$, the etching characters can finely be adjusted.

A hydrofluorocarbon gas (or a fluorocarbon gas) such as $CHF_3$ or $CF_4$ is an etching gas which has widely been used hitherto. Therefore, in the case in which the mixed gas of $CHF_3$ and $N_2$ or the mixed gas of $CF_4$ and $N_2$ is used, an advantage that introduction of new facilities is unnecessary is produced. Moreover, the mixed gas is easy to handle since the mixed gas has no toxicity.

In the case in which the mixed gas of $CHF_3$ and $N_2$ is used to dry-etch the silicon carbonitride film or the silicon carbide film, the flow ratio of the $CHF_3$ to $N_2$ is from 1/0.1 to 200, preferably from 1/0.2 to 20, and more preferably from 1/0.5 to 10.

In order to adjust the concentration or the flow rate of this mixed gas, an inert gas such as Ar may be added to the mixed gas. For example, in the case in which an etching machine having a high exhaust capability is used, a deposit does not adhere easily to the surface of the substrate 1 by supplying a large amount of the mixed gas diluted with an inert gas such as Ar to the treating chamber and discharging a reaction product generated by etching speedily.

In order to prevent the oxidization of the surface of the Cu interconnections 21, a gas which does not substantially contain any oxygen should be supplied as the above-mentioned mixed gas to the treating chamber. However, the mixed gas supplied to the treating chamber may contain oxygen generated from a member made of quartz glass or the like member at a very small level, that is, at a ratio of about 1 to 2%. However, even in such a case, it is necessary that the oxygen content in the mixed gas is controlled to at most 3%, preferably 1.5% or less.

The diffusion barrier layer for preventing the diffusion of Cu, and the etching stopper layer may be the silicon nitride film used in Embodiment 2, as well as the silicon carbonitride film or silicon carbide film. It is also being investigated to introduce a silicon carboxide (SiOC) film, which has a smaller dielectric constant than the silicon nitride film. The etching gas (the mixed gas of $CHF_3$ and $N_2$, and the mixed gas of $CF_4$ and $N_2$) in the present embodiment can be applied to the case in which silicon nitride films or silicon carboxide films are used as a diffusion barrier layer for preventing the diffusion of Cu and an etching stopper layer.

Figure 31:
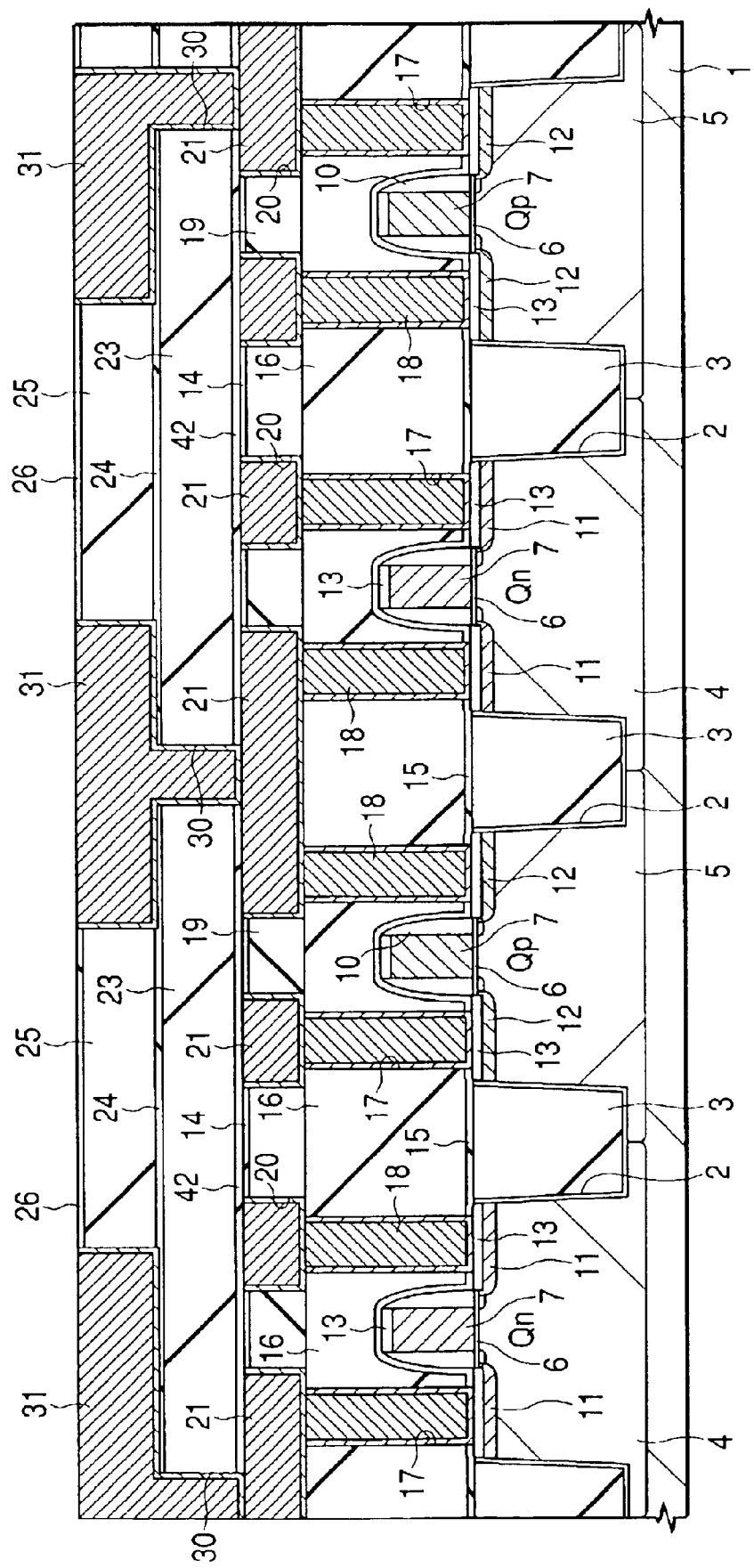
FIG. 31 is a sectional view of a principal portion of a semiconductor substrate illustrating a process of fabricating a semiconductor integrated circuit device which is further another embodiment present invention.

FIG. 31 illustrates a state that Cu interconnections 31 as a second layer are formed inside the interconnection grooves 30 formed by the above-mentioned method. The Cu interconnections 31 can be formed by the same method as in Embodiment 1.

Figure 32:
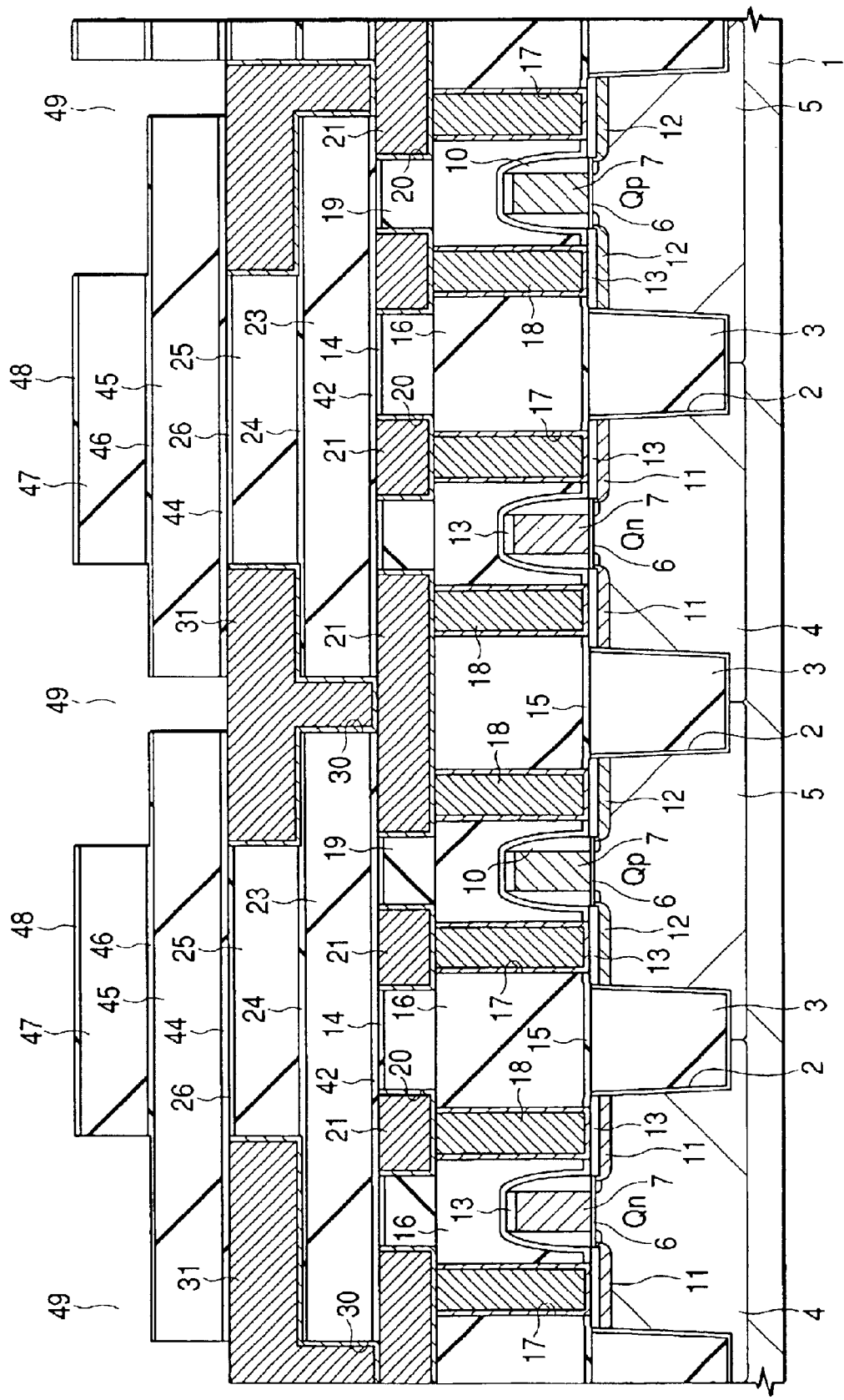
FIG. 32 is a sectional view of a principal portion of the semiconductor substrate illustrating the process of fabricating the semiconductor integrated circuit device which is further another embodiment of the present invention.

FIG. 32 illustrates a state that a lamination layer made of plural insulating films is formed over the Cu interconnections 31 as the second layer in order to form Cu interconnections as a third layer, and subsequently this lamination film is dry-etched to form interconnection grooves 49.

The lowermost layer of the lamination film is a silicon carbonitride film 44 functioning as a diffusion barrier layer for the Cu interconnections 31. The diffusion barrier layer for the Cu interconnections 31 may be made of a silicon carbide film.

Two SiOF films 45 and 47, which are interlayer insulating films, and two silicon nitride films 46 and 48, which are etching stopper layers, are formed over the silicon carbonitride film 44. As the interlayer insulating films, there may be used a silicon oxide-based insulating film such as HSQ or MSQ, examples of which are given in Embodiment 2, as well as the SiOF film.

The method of forming the interconnections grooves 49 is the same method of forming the underlying interconnection grooves 30 except that the kinds of the gas for dry-etching the lamination film are different. For etching the SiOF films 45 and 47, the mixed gas of $C_4F_8$, Ar and oxygen used in Embodiment 2 is used, and for etching the silicon nitride films 46 and 48, the mixed gas of $SF_6$, HBr and $N_2$ used in Embodiment 2 is used.

In order to etch the silicon carbonitride film 44, which is a diffusion barrier layer for the Cu interconnections 31, the mixed gas of $CHF_3$ and $N_2$, or the mixed gas of $CF_4$ and $N_2$ used when the underlying silicon carbonitride film 42 is etched may also be used. Since the mixed gas contains carbon (C), it is difficult to ensure the selective ratio to the silicon oxide-based, SiOF films 45 and 47. In other words, when the above-mentioned mixed gas is used in the state that the SiOF films 45 and 47 are exposed to the side walls of the interconnection grooves 49 so as to etch the silicon carbonitride film 42, carbon (C) contained in the mixed gas reacts with oxygen (O) contained in the SiOF films 45 and 47 so that carbon and oxygen are discharged as carbon monoxide (CO) or carbon dioxide ($CO_2$). Therefore, the side walls of the interconnection grooves 49 are side-etched.

Consequently, in the case in which the interlayer insulating films are made of a silicon oxide-based insulating film, it is advisable to use the mixed gas of $SF_6$ and $NH_3$ used in Embodiment 1 in order to etch the silicon carbonitride film 44, which is a diffusion barrier layer for the Cu interconnections 31.

Figure 33:
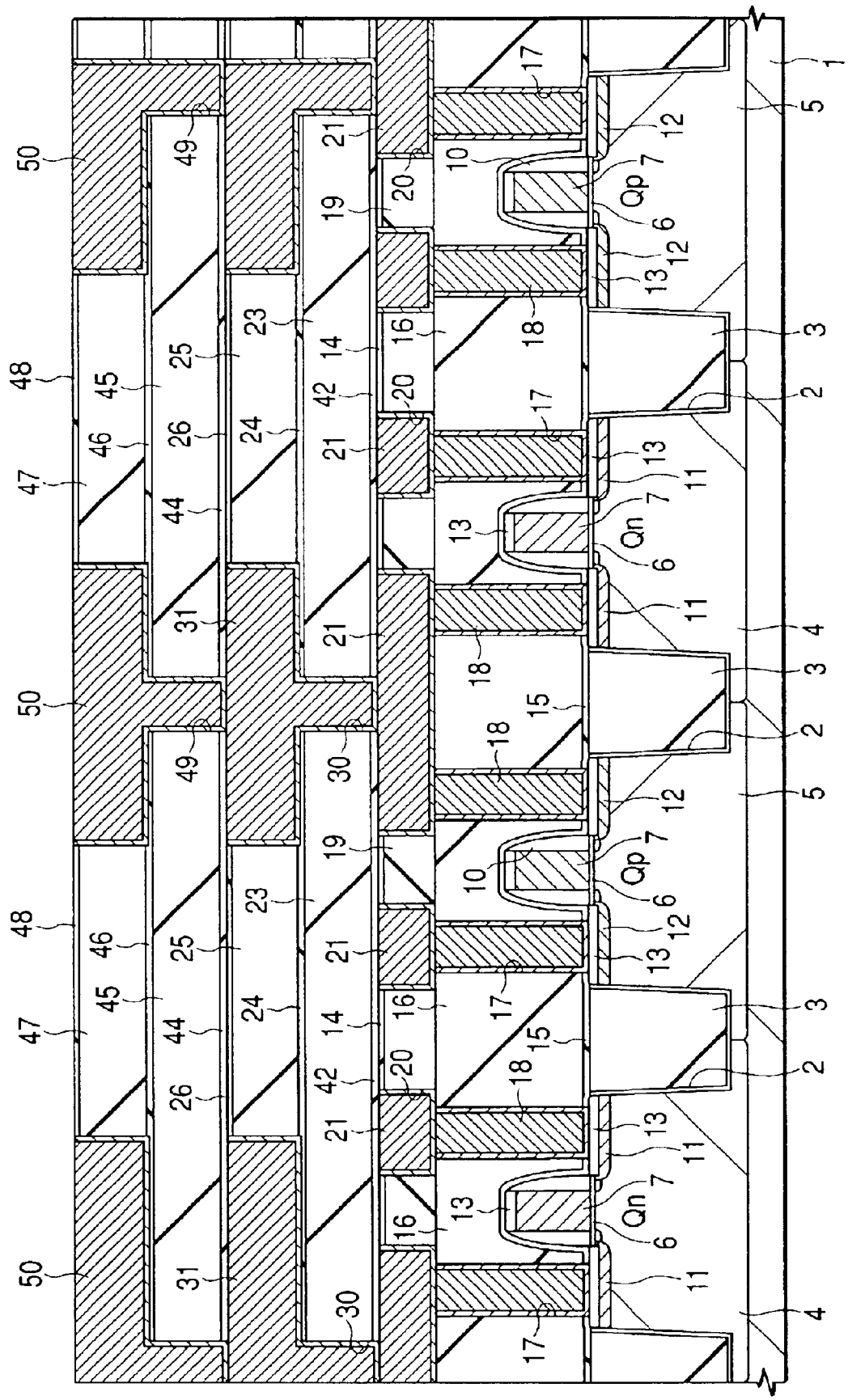
FIG. 33 is a sectional view of a principal portion of the semiconductor substrate illustrating the process of fabricating the semiconductor integrated circuit device which is further another embodiment of the present invention.

FIG. 33 illustrates a state that Cu interconnections 50 as a third layer are formed inside the interconnection grooves 49 formed by the above-mentioned steps. The Cu interconnections 50 can be formed by the same method as in Embodiment 1.

The present invention made by the inventors has been specifically described by way of the preferred embodiments of the present invention. However, the present invention is not limited to the above-mentioned embodiments and can be varied within the scope that does not depart from the subject matter of the present invention.

The advantageous effect gained by typical embodiments of the invention disclosed in the present application will be briefly described as follows.

When a first insulating film which comprises, as a main component, silicon carbide and underlies a conductive layer comprising, as a main component, copper is dry-etched, the first insulating film can be anisotropically etched by using a mixed gas of a first etching gas comprising at least one selected from the group consisting of $SF_6$, HCl, HBr, $Cl_2$, $ClF_3$, and $CF_4$, and a second etching gas comprising at least one selected from the group consisting of $NH_3$, $N_2H_4$, and a mixed gas of $N_2$ and $H_2$. Moreover, it is possible to suppress defects that a deposit or a reactant is generated on the surface of the conductive layer.

What is claimed is:

1. A process of fabricating a semiconductor integrated circuit device comprising the steps of:

(a) forming a first interconnection made of a first conductive film containing copper as a main component over a main face of a semiconductor substrate;

(b) forming a first insulating film containing silicon carbide or silicon carbonitride as a main component over the first interconnection;

(c) forming a first interlayer insulating film over the first insulating film and subsequently dry-etching a portion of the first interlayer insulating film to make a portion of the first insulating film exposed;

(d) using a first etching gas to dry-etch the first insulating film exposed in the step (c), to form a first interconnection groove wherein the surface of the first interconnection is exposed to its bottom;

(e) forming a second interconnection made of a conductive film containing copper as a main component inside the first interconnection groove;

(f) forming a second insulating film containing silicon carbide or silicon carbonitride as a main component over the second interconnection;

(g) forming a second interlayer insulating film over the second insulating film and subsequently dry-etching a portion of the second interlayer insulating film to make a portion of the second insulating film exposed;

(h) using a second etching gas to dry-etch the second insulating film exposed in the step (g), to form a second interconnection groove wherein the surface of the second interconnection is exposed to its bottom; and (i) forming a third interconnection made of a conductive film containing copper as a main component inside the second interconnection groove, wherein one of the first and second etching gases is a mixed gas of a third etching gas comprising at least one selected from the group made of $SF_6$, HCl, HBr, $Cl_2$, $ClF_3$ and $CF_4$ and a fourth etching gas comprising at least one selected from the group made of $NH_3$, $H_2H_4$, and a mixed gas of $N_2$ and $H_2$;

wherein the other thereof is a mixed gas of at least one of $CHF_3$ and $CF_4$, and $N_2$; and wherein both of the first and second etching gases have a quality of substantially avoiding oxidizing the surface of the interconnection made of a conductive film containing copper.

2. The process according to claim 1, wherein the one of the first and second etching gases is a mixed gas of $SF_6$ and $NH_3$ and the other is a mixed gas of $CHF_3$ and $N_2$.

3. The process according to claim 1, wherein the first interlayer insulating film is an organic insulating film having a smaller dielectric constant than silicon oxide, the first etching gas is a mixed gas of $CHF_3$ and $N_2$, and when the second interlayer insulating film is an insulating film containing a siloxane-based insulating material as a main component, the second etching gas is a mixed gas of $SF_6$ and $NH_3$.

4. The process according to claim 3, wherein the first interlayer film is a coating film containing an aromatic polymer as a main component.

5. The process according to claim 3, wherein the second interlayer insulating film is an insulating film containing SiOF as a main component.

6. A process of fabricating a semiconductor integrated circuit device comprising the steps of:

(a) forming a conductive layer containing copper as a main component over a main face of a semiconductor substrate;

(b) forming a first insulating film containing silicon carbide or silicon carbonitride as a main component over the conductive layer;

(c) forming a second insulating film made of an organic insulating film having a smaller dielectric constant than silicon oxide over the first insulating film;

(d) using a gas containing nitrogen and hydrogen to dry-etch a portion of the second insulating film, thereby making a portion of the first insulating film exposed; and (e) using a mixed gas of $SF_6$ and $NH_3$, which does not contain oxygen, to dry-etch a portion of the first insulating film, thereby making an opening wherein the surface of the conductive layer is exposed to its bottom.

7. A process of fabricating a semiconductor integrated circuit device comprising the steps of:

(a) forming a conductive layer containing copper as a main component over a main face of a semiconductor substrate;

(b) forming a first insulating film containing silicon carbide, silicon carbonitride or silicon carboxide as a main component over the conductive layer;

(c) forming a second insulating film made of an organic insulating film having a smaller dielectric constant than silicon oxide over the first insulating film;

(d) using a gas containing nitrogen and hydrogen to dry-etch a portion of the second insulating film, thereby making a portion of the first insulating film exposed; and (e) using a mixed gas of a first etching gas comprising at least one selected from the group made of $SF_6$, HCl, HBr, $Cl_2$, $ClF_3$ and $CF_4$ and a second etching gas comprising at least one selected from the group made of $NH_3$, $N_2H_4$, and a mixed gas of $N_2$ and $H_2$ to dry-etch a portion of the first insulating film, wherein the mixed gas of the first etching gas and the second etching gas has a quality of substantially avoiding oxidizing the surface of the conductive layer containing copper, thereby making an opening wherein the surface of the conductive layer is exposed to its bottom.

* * * * *